US012588324B2

(12) United States Patent
Liu et al.

(10) Patent No.: US 12,588,324 B2
(45) Date of Patent: Mar. 24, 2026

(54) PACKAGE STRUCTURE AND FORMING METHOD THEREOF

(71) Applicant: Lextar Electronics Corporation, Hsinchu (TW)

(72) Inventors: Kang-Hung Liu, Hsinchu (TW); Chih-Hao Lin, Hsinchu (TW); Shiou-Yi Kuo, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 641 days.

(21) Appl. No.: 17/931,583

(22) Filed: Sep. 13, 2022

(65) Prior Publication Data

US 2023/0155062 A1     May 18, 2023

(30) Foreign Application Priority Data

Nov. 17, 2021     (TW) ................................. 110142699

(51) Int. Cl.
H10H 20/831     (2025.01)
H01L 23/00     (2006.01)
(Continued)

(52) U.S. Cl.
CPC ........... H10H 20/831 (2025.01); H01L 24/29 (2013.01); H01L 24/32 (2013.01); H01L 25/13 (2013.01);
(Continued)

(58) Field of Classification Search
CPC ............................. H01L 25/0756; H01L 25/13
See application file for complete search history.

(56) References Cited

U.S. PATENT DOCUMENTS

| | | | |
|---|---|---|---|
| 7,982,228 B2 | 7/2011 | Choi et al. | |
| 8,227,927 B2 | 7/2012 | Chen et al. | |

(Continued)

FOREIGN PATENT DOCUMENTS

| | | |
|---|---|---|
| CN | 110783366 A | 2/2020 |
| JP | H0870140 A | 3/1996 |

(Continued)

OTHER PUBLICATIONS

JP Office Action dated Sep. 12, 2023 in Japanese application No. 2022-164386.

(Continued)

*Primary Examiner* — Evren Seven
(74) *Attorney, Agent, or Firm* — McClure, Qualey & Rodack, LLP

(57) ABSTRACT

A package structure is provided. The package structure has a light-emitting region and a non-light-emitting region that is adjacent to the light-emitting region, and includes a substrate, a first light-emitting layer, a second light-emitting layer and a third light-emitting layer. The first light-emitting layer, the second light-emitting layer and the third light-emitting layer are sequentially stacked on the substrate. Each of the first light-emitting layer, the second light-emitting layer and the third light-emitting layer includes a transparent adhesive layer disposed in the light-emitting region, a light-emitting diode (LED) chip disposed on the transparent adhesive layer, a redistribution layer formed on the LED chip and extending from the light-emitting region to the non-light-emitting region, and a planarization layer disposed on the LED chip and the redistribution layer.

36 Claims, 17 Drawing Sheets

(51) Int. Cl.

| | | |
|---|---|---|
| *H01L 25/13* | (2006.01) | |
| *H01L 25/16* | (2023.01) | |
| *H10H 20/01* | (2025.01) | |
| *H10H 20/84* | (2025.01) | |
| *H10H 20/853* | (2025.01) | |

(52) U.S. Cl.

CPC ......... *H01L 25/167* (2013.01); *H10H 20/018* (2025.01); *H10H 20/84* (2025.01); *H10H 20/853* (2025.01); *H01L 2224/2919* (2013.01); *H01L 2224/32145* (2013.01); *H01L 2224/32225* (2013.01); *H10H 20/032* (2025.01); *H10H 20/034* (2025.01); *H10H 20/0362* (2025.01)

(56) References Cited

U.S. PATENT DOCUMENTS

| | | | | |
|---|---|---|---|---|
| 9,761,510 | B2 | 9/2017 | Liu | |
| 10,937,924 | B2* | 3/2021 | Zou | H10H 20/831 |
| 11,322,488 | B2* | 5/2022 | Chang | H10H 20/857 |
| 11,552,061 | B2 | 1/2023 | Chae et al. | |
| 12,074,151 | B2* | 8/2024 | Xu | H10H 20/853 |
| 12,310,159 | B2* | 5/2025 | Chen | H10H 20/01 |
| 2003/0213967 | A1* | 11/2003 | Forrest | H10K 59/32 |
| | | | | 427/78 |
| 2005/0093427 | A1 | 5/2005 | Wang et al. | |
| 2005/0140278 | A1* | 6/2005 | Kato | H10K 50/841 |
| | | | | 313/506 |
| 2007/0170444 | A1* | 7/2007 | Cao | H10H 29/14 |
| | | | | 257/E33.012 |
| 2008/0068315 | A1* | 3/2008 | Kurosaki | G02F 1/1345 |
| | | | | 345/87 |
| 2009/0078955 | A1 | 3/2009 | Fan et al. | |
| 2010/0051975 | A1* | 3/2010 | Suzuki | H01L 25/0756 |
| | | | | 257/E33.056 |
| 2015/0333096 | A1 | 11/2015 | Dohi et al. | |
| 2017/0104035 | A1* | 4/2017 | Lee | H10K 59/35 |
| 2017/0288093 | A1* | 10/2017 | Cha | H10H 20/8312 |
| 2018/0042110 | A1 | 2/2018 | Cok | |
| 2019/0081210 | A1 | 3/2019 | Kuo et al. | |
| 2019/0165037 | A1* | 5/2019 | Chae | H10H 20/833 |
| 2019/0165207 | A1 | 5/2019 | Kim et al. | |
| 2019/0189681 | A1 | 6/2019 | Chae et al. | |
| 2019/0198565 | A1 | 6/2019 | Lee et al. | |
| 2020/0258872 | A1* | 8/2020 | Lee | H10H 20/857 |
| 2021/0384181 | A1* | 12/2021 | Xu | H01L 24/33 |
| 2022/0005792 | A1* | 1/2022 | Chae | H01L 25/16 |

FOREIGN PATENT DOCUMENTS

| | | |
|---|---|---|
| JP | 2005142556 A | 6/2005 |
| JP | 2011159671 A | 8/2011 |
| JP | 2021508840 A | 3/2021 |
| KR | 20190061227 A | 6/2019 |
| TW | 201114009 A | 4/2011 |
| TW | 201543636 A | 11/2015 |

OTHER PUBLICATIONS

English (machine) translation of JP Office Action dated Sep. 12, 2023 in Japanese application No. 2022-164386.

Chinese language office action dated Jan. 11, 2022, issued in application No. TW 110142699.

\* cited by examiner

PACKAGE STRUCTURE AND FORMING METHOD THEREOF

CROSS REFERENCE TO RELATED APPLICATIONS

This application claims priority of Taiwan Patent Application No. 110142699, filed on Nov. 17, 2021, the entirety of which is incorporated by reference herein.

BACKGROUND

Technical Field

The disclosure is related to a package structure and a forming method thereof, and in particular, it is related to a package structure including vertically stacked light-emitting diode (LED) chips and a forming method thereof.

Description of the Related Art

Continuous advances in display technology has seen RGB LEDs used as display pixels and a light source for some display panels, gradually replacing the more conventional liquid-crystal display panels. Since the energy consumption of LEDs is low, display panels using LEDs may run more efficiently and save energy compared with conventional liquid-crystal display panels, and they may also reduce carbon emissions, making them more environmentally friendly. Therefore, display panels using LEDs have drawn much attention in the display field. It is hard to realize small-pitch operation for the RGB display because of the process limit of the package technology of the surface mounted device. However, improvements have been sought to existing display devices to adopt chip-on-board (COB) technology. Both mini LEDs and micro LEDs would realize small-pitch operation.

Although existing package structures have been adequate for their intended purposes, they have not been entirely satisfactory in all respects. Accordingly, improvements in the package structures and a forming method thereof are still necessary to produce display devices that meet market demand.

BRIEF SUMMARY OF THE DISCLOSURE

In accordance with some embodiments of the disclosure, a package structure is provided. The package structure has a light-emitting region and a non-light-emitting region that is adjacent to the light-emitting region, and includes a substrate, a first light-emitting layer, a second light-emitting layer and a third light-emitting layer. The first light-emitting layer, the second light-emitting layer and the third light-emitting layer are sequentially stacked on the substrate. Each of the first light-emitting layer, the second light-emitting layer and the third light-emitting layer includes a transparent adhesive layer disposed in the light-emitting region, a light-emitting diode (LED) chip disposed on the transparent adhesive layer, a redistribution layer formed on the LED chip and extending from the light-emitting region to the non-light-emitting region, and a planarization layer disposed on the LED chip and the redistribution layer.

In accordance with some embodiments of the disclosure, a package structure is provided. The package structure has a light-emitting region and a non-light-emitting region that is adjacent to the light-emitting region. The package structure includes a substrate, a first light-emitting unit, a first planarization layer, a second light-emitting unit, a third light-emitting unit, and a second planarization layer. The first light-emitting unit is disposed on the substrate. The first planarization layer is disposed on the first light-emitting unit. The second light-emitting unit and the third light-emitting unit are disposed on the first planarization layer and laterally separated from each other. The second planarization layer is disposed on the second light-emitting unit and the third light-emitting unit. Each of the first light-emitting unit, the second light-emitting unit, and the third light-emitting unit includes a transparent adhesive layer, an LED chip, and a redistribution layer. The transparent adhesive layer is disposed in the light-emitting region. The LED chip is disposed on the transparent adhesive layer. The redistribution layer is formed on the LED chip, and extends from the light-emitting region to the non-light-emitting region.

In accordance with some embodiments of the disclosure, a method for forming a package structure is provided. The method includes providing a source wafer on which a plurality of LED chips is disposed. Each of the LED chips is connected to the source wafer through a tethered structure. The method further includes providing a target substrate having a pre-determined light-emitting region and a pre-determined non-light-emitting region adjacent to the pre-determined light-emitting region. A first electrode, a second electrode, a third electrode, and a common electrode are disposed in the pre-determined non-light-emitting region of the target substrate and are in physical contact with the target substrate. The method further includes sequentially forming a first light-emitting layer, a second light-emitting layer, and a third light-emitting layer on the target substrate. Each of forming the first light-emitting layer, forming the second light-emitting layer, and forming the third light-emitting layer includes transferring one LED chip on the source wafer to the pre-determined light-emitting region of the target substrate using a pickup device and forming a redistribution layer on the LED chip. The redistribution layer extends from the pre-determined light-emitting region to the pre-determined non-light-emitting layer. Each of forming the first light-emitting layer, forming the second light-emitting layer, and forming the third light-emitting layer further includes forming a planarization layer on the LED chip and the redistribution layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE DISCLOSURE

Figures 1, 2A:
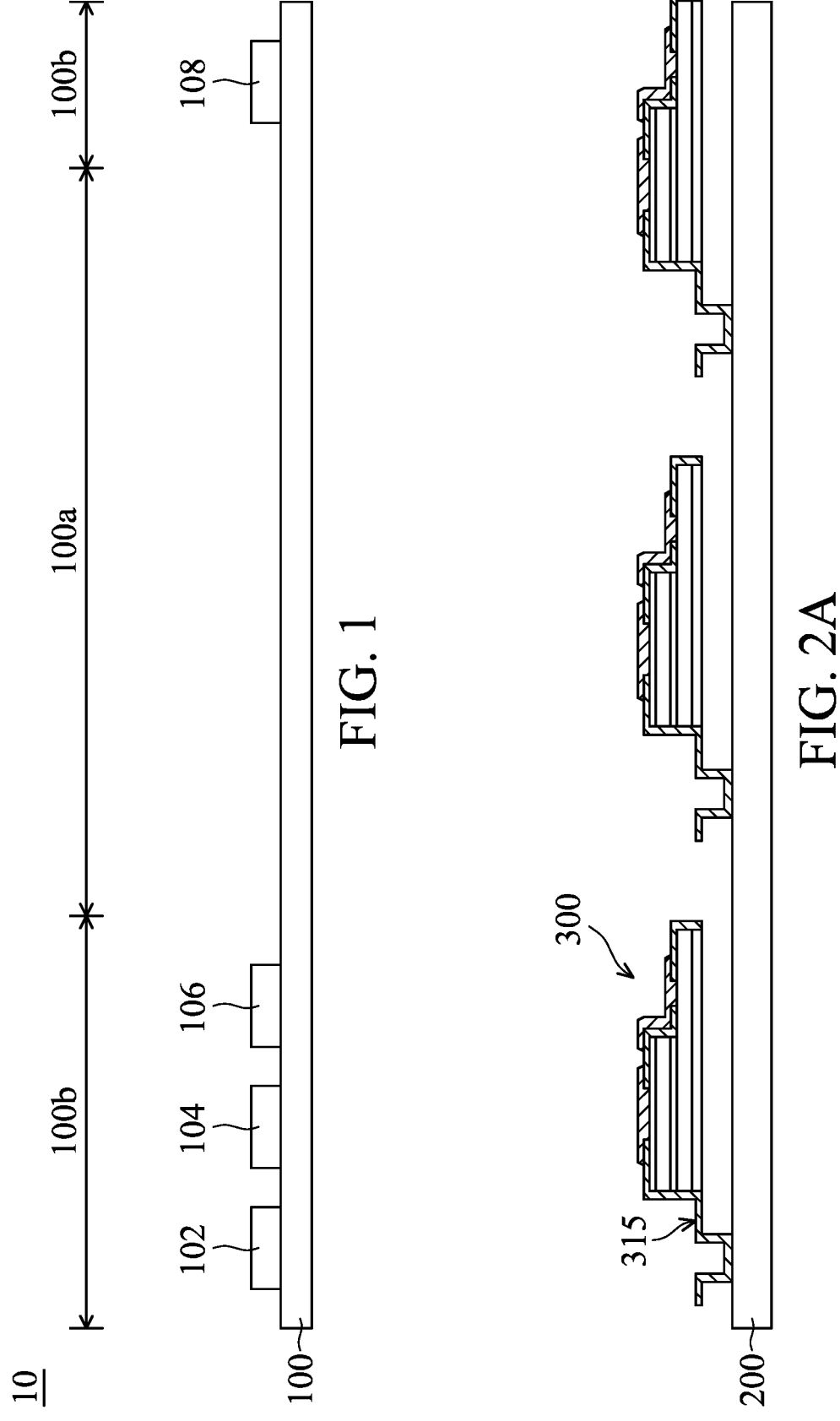
FIG. 1 illustrates a cross-sectional view of a package structure at the intermediate stage of its forming process according to some embodiments.
FIG. 2A illustrates a cross-sectional view of a source wafer on which a plurality of LED chips is disposed according to some embodiments.

The package structure and a forming method thereof of the disclosure are described in detail in the following description. It should be appreciated that the following disclosure provides many different embodiments, or examples, for implementing different features of the disclosure. Specific examples of elements and arrangements are described below to clearly describe the disclosure in a simple manner. These are, of course, merely examples and are not intended to be limiting. In addition, different embodiments may use like and/or corresponding reference numerals to denote like and/or corresponding elements for clarity. However, like and/or corresponding reference numerals are used merely for the purpose of clarity and simplicity, and do not suggest any correlation between different embodiments.

According to some embodiments of the disclosure, the package structure includes a first light-emitting layer, a second light-emitting layer, and a third light-emitting layer sequentially stacked above the substrate. Each of the first light-emitting layer, the second light-emitting layer, and the third light-emitting layer includes a transparent adhesive layer, an LED chip, a redistribution layer, and a planarization layer. The LED chips emitting light with different colors are disposed along the vertical direction in the package structure, and the electrodes used for transmitting signals to the LED chips are disposed on the substrate. Therefore, the package structure with stacked LED chips may reduce the area of a single pixel in a display device, and may enhance the integrated density of pixels and the resolution of the display device. Furthermore, according to some embodiments of the disclosure, the method for forming the package structure includes transferring a single LED chip or LED chips with a certain period from a source wafer to a target substrate. The non-transferred LED chips may remain for the next process. This way, space utilization of the source wafer may be increased, the process of the package structure may be simplified, and the yield of the package structure may be improved.

FIG. 1 illustrates a cross-sectional view of a package structure 10 at the intermediate stage of its forming process according to some embodiments. First, a target substrate 100 is provided. The target substrate 100 has a pre-determined light-emitting region 100a and a pre-determined non-light emitting region 100b that is adjacent to the pre-determined light-emitting region 100a. In some embodiments, the pre-determined light-emitting region 100a may surround the pre-determined non-light emitting region 100b. It should be understood that, after completing the package structure 10, the target substrate 100 may be abbreviated as a substrate 100, and the pre-determined light-emitting region 100a and the pre-determined non-light emitting region 100b may be respectively abbreviated as a light-emitting region 100a and a non-light-emitting region 100b.

As shown in FIG. 1, electrodes 102, 104, 106, and a common electrode 108 are disposed in the pre-determined non-light-emitting region 100b of the target substrate 100. According to some embodiments, the electrodes 102, 104, 106, and the common electrode 108 may be in physical contact with the target substrate 100.

In some embodiments, the target substrate 100 may be a backplane of a display device. In particular, the backplane of the display device may include a circuit substrate, such as a thin film transistor substrate or a glass substrate, a quartz substrate, or a silicon substrate having conductive wires. In other embodiments, the target substrate 100 may be an interposer substrate. The interposer substrate may include multiple metal wire layers and a plurality of vias connecting the metal wire layers. In addition, in some embodiments, the target substrate 100 may be a transparent substrate. Specifically, the transparent substrate may have a light transmittance to light with a wavelength in a range from 200 nm to 1100 nm greater than 90%, or preferably greater than 95%.

In some embodiments, the material of the electrodes 102, 104, 106, and the common electrode 108 disposed in the pre-determined non-light-emitting region 100b of the target substrate 100 may include any suitable conductive materials, such as Al, Cu, W, Ti, Cr, Pt, Au, Ta, Ni, TiN, TaN, NiSi, CoSi, TaC, TaSiN, TaCN, TiAl, TiAlN, indium tin oxide (ITO), other suitable conductive materials, or a combination thereof.

Figure 2B:
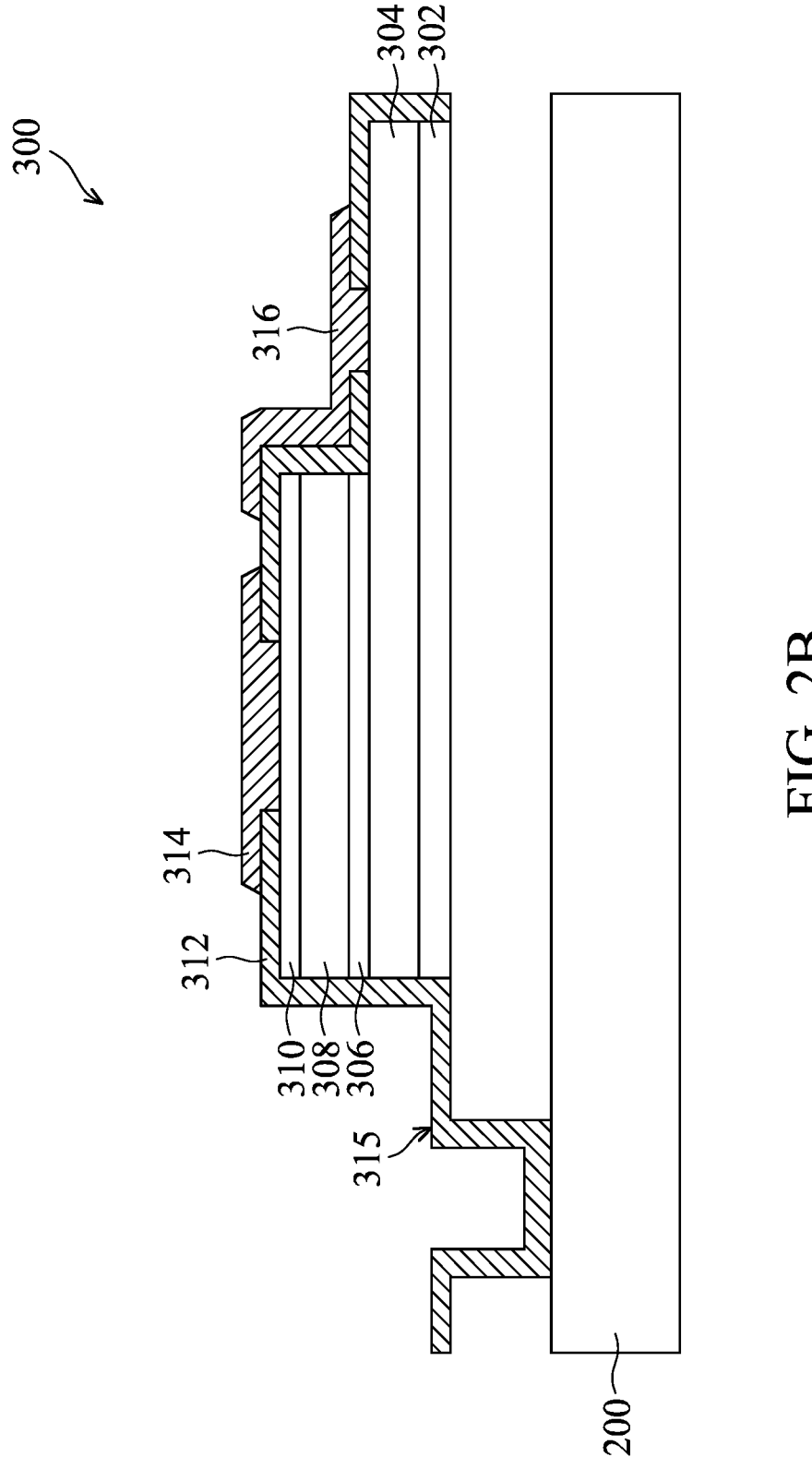
FIG. 2B illustrates an enlarged cross-sectional view of an LED chip according to some embodiments.

FIG. 2A illustrates a cross-sectional view of a source wafer 200 on which a plurality of LED chips 300 is disposed according to some embodiments, and FIG. 2B illustrates an enlarged cross-sectional view of an LED chip 300 according to some embodiments. Referring to FIG. 2A, the source wafer 200 is provided. A plurality of LED chips 300 is disposed on the source wafer 200, and each of the LED chips 300 is connected to the source wafer 200 through a tethered structure 315. According to some embodiments, as shown in FIG. 2A, each of the LED chips 300 is suspended above the source wafer 200 through the tethered structure 315. In some embodiments, the source wafer 200 may be a silicon wafer. In some embodiments, the LED chips 300 disposed on the source wafer 200 may be LED chips emitting blue light, red light, or green light.

Referring to FIG. 2B, according to some embodiments, the LED chip 300 may include, from the bottom to the top, a base layer 302, a n-type semiconductor layer 304, a light-emitting layer 306, a p-type semiconductor layer 308, an ohmic contact layer 310, and a protection layer 312. In particular, the protection layer 312 may be formed on a portion of the top surfaces of the n-type semiconductor layer 304 and the ohmic contact layer 310, and may conformally extend to sidewalls of the base layer 302, n-type semiconductor layer 304, the light-emitting layer 306, the p-type semiconductor layer 308, and the ohmic contact layer 310. The LED chip 300 may further include a first electrode 314 and a second electrode 316. The first electrode 314 and the second electrode 316 are formed on the protection layer 312 and further penetrates through a portion of the protection layer 312 to be in physical contact with the ohmic contact layer 310 and the n-type semiconductor layer 304, respectively.

According to some embodiments, the base layer 302 of the LED chip 300 may be a sapphire substrate. According to some embodiments of the disclosure, the n-type semiconductor layer 304 may be a n-doped III-V semiconductor layer. For example, the III-V semiconductor layer may include GaAs, GaN, GaP, InAs, GaAsP, AlGaAs, InGaP, InGaN, AlInGaP, InGaAsP, suitable III-V semiconductor epitaxial materials, or a combination thereof. Furthermore, in some embodiments, the III-V semiconductor layer may be doped with group IVA elements (e.g., silicon) to form the n-doped III-V semiconductor layer.

According to some embodiments of the disclosure, the p-type semiconductor layer 308 may be a p-doped III-V semiconductor layer. The III-V semiconductor layer may include GaAs, GaN, GaP, InAs, AN, InN, InP, GaAsP, AlGaAs, InGaP, InGaN, AlInGaP, InGaAsP, suitable III-V semiconductor epitaxial materials, or a combination thereof. Furthermore, in some embodiments, the III-V semiconductor layer may be doped with group IIA elements (e.g., Be, Mg, Ca, or Sr) to form the p-doped semiconductor layer.

In some embodiments, the light-emitting layer 306 may include a multiple quantum well (MQW), a single quantum well (SQW), a homo-junction, a hetero-junction, or the like. In some embodiments, the ohmic contact layer 310 may include a transparent conductive material or an opaque conductive material. For example, the transparent conductive material may include indium tin oxide (ITO), indium zinc oxide (IZO), aluminum zinc oxide (AZO), other transparent conductive materials, or a combination thereof. The opaque conductive material may include Ni, Ag, or a Ni/Au alloy.

In some embodiments, the protection layer 312 may include any suitable insulating materials, such as silicon oxide, silicon nitride, silicon oxynitride, epoxy, photoresist materials, other suitable materials, or a combination thereof. In some embodiments, the materials of the first electrode 314 and the second electrode 316 may include Al, Cu, Ni, Au, Pt, Ti, an alloy thereof, or other suitable conductive materials.

According to some embodiments, a sacrificial layer (not shown) may be formed on the source wafer 200 first, and the layers of the LED chip 300 (such as the base layer 302, the n-type semiconductor layer 304, the light-emitting layer 306, the p-type semiconductor layer 308, and the ohmic contact layer 310) may be formed on the sacrificial layer. Next, a portion of the sacrificial layer may be removed using suitable etching processes to form an opening around the LED chip 300 that exposes the source wafer 200. The protection layer 312 is formed on the n-type semiconductor layer 304 and the ohmic contact layer 310. The protection layer 312 may be further conformally formed on the sidewalls of the base layer 302, the n-type semiconductor layer 304, the light-emitting layer 306, the p-type semiconductor layer 308, and the ohmic contact layer 310, on a portion of the sacrificial layer, and in the aforementioned opening. Subsequently, the sacrificial layer may be removed using suitable etching methods. As shown in FIG. 2B, after removing the sacrificial layer, a portion of the protection layer 312 may be formed as the tethered structure 315, and the LED chip 300 may be suspended above the source wafer 200 through the tethered structure 315. After removing the sacrificial layer, the overlying structure is supported only by the tethered structure 315. Therefore, the tethered structure 315 may be easily broken to separate the LED chip 300 and the source wafer 200.

Figures 2C, 2D:
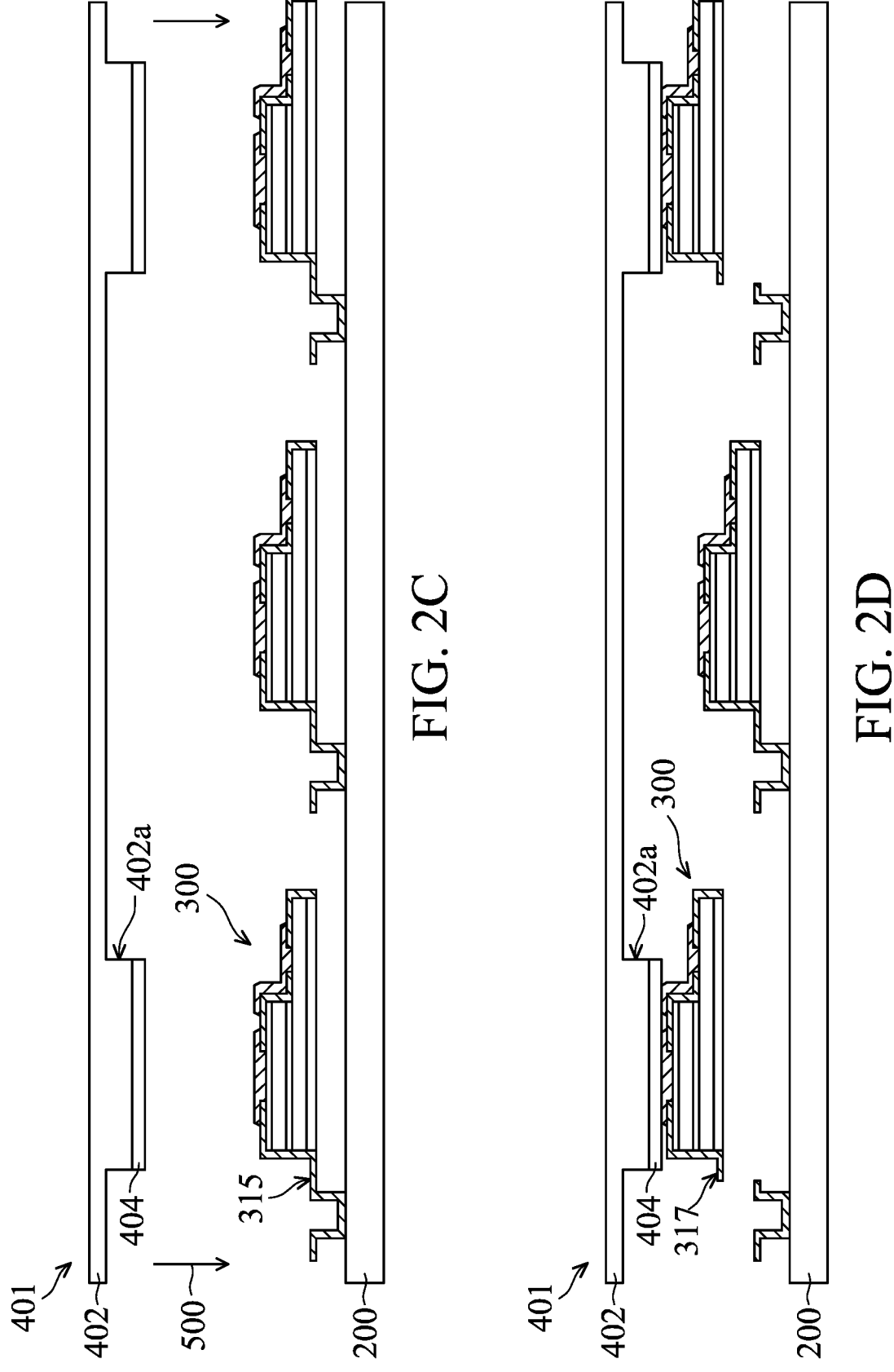
FIGS. 2C and 2D illustrate the process of transferring LED chips from a source wafer according to some embodiments.

FIGS. 2C and 2D illustrate the process of transferring LED chips 300 from the source wafer 200 according to some embodiments. The LED chips 300 are picked up using a pickup device 401. In some embodiments, as shown in FIG. 2C, the pickup device 401 may include a base 402. The base 402 has protruding portions 402a formed with a specific period. For example, in some embodiments, as shown in FIG. 2C, the protruding portions 402 may be formed every two LED chips 300, but the disclosure is not limited thereto. The protruding portions 402 may be formed with different periods according to actual process needs. For example, the protruding portions 402a may be formed every three, every four, every five or more LED chips. The base 402 has the protruding portions 402a formed with a specific period to transfer a single LED chip 300 or LED chips 300 with a certain period to the target substrate. The remaining non-transferred LED chips may be used for the next round of the process. This way, space utilization of the source wafer 200 may be increased, the process of the package structure may be simplified, and the yield of the package structure may be increased.

According to some embodiments, the base 402 may include a flexible adhesive polymeric material, such as a flexible polymer material, to attach to the LED chips 300 after the tethered structures 315 are broken. Specifically, the flexible polymer material may include a poly-siloxane-based material, such as polydimethylsiloxane (PDMS). However, in other embodiments, the base 402 may include a material without adhesiveness. For example, in some embodiments, the material without adhesiveness may include silicon oxide ($SiO_x$), silicon nitride ($SiN_x$), silicon oxynitride ($SiO_xN_y$), or other suitable materials.

In the embodiments where the base 402 includes a material without adhesiveness, as shown in FIG. 2C, the pickup device 401 may further include an adhesive layer 404 disposed on the surface of the protruding portion 402a of the base 402. In some embodiments, the adhesive layer 404 may include poly-carbonate, polycarbodiimide, epoxy resin, poly-vinyl acetal, acrylic resin, polyester, other suitable adhesive materials, or a combination thereof.

Referring again to FIG. 2C, a pickup process 500 is performed. During the pickup process 500, the pickup device 401 applies pressure to the LED chips 300 to break the tethered structure 315 that connects the LED chips 300 and the source wafer 200. After the tethered structure 315 is broken, the LED chips 300 are separated from the source wafer 200 at the tethered structure 315.

Referring to FIG. 2D, the contact surfaces (such as the protruding portions 402a or the adhesive layer 404) between the pickup device 401 and the LED chips 300 are adhesive, and accordingly the LED chips 300 without support may be attached to the pickup device 401. In addition, in some embodiments, after the tethered structure 315 is broken, a portion of the tethered structure 315 in FIG. 2C (may be also referred to as a tethered structure 317) may remain on the outer edge of the LED chip 300. It should be noted that the tethered structure 317 may not be shown in the following figures since the cross-sectional views may not be cross-sections of the package structure that include the tethered structure 317.

Figures 3A, 3B, 4:
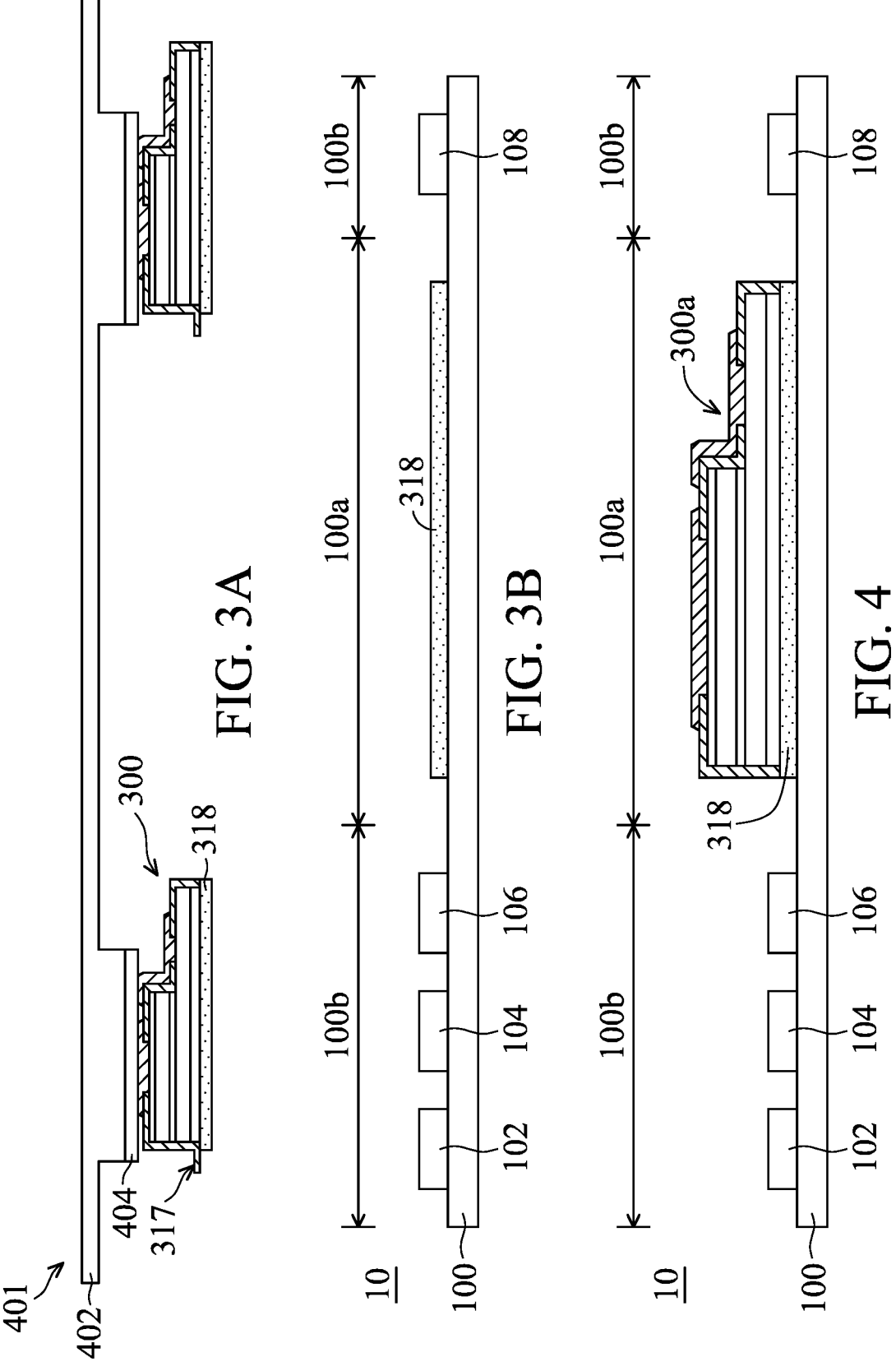
FIGS. 3A and 3B illustrate attachment of a transparent adhesive layer to the bottom surface of the LED chip or formation of the transparent adhesive layer on a target substrate.
FIGS. 4 and 5A illustrate cross-sectional views of a package structure at the intermediate stages of its forming process according to some embodiments.

FIGS. 3A and 3B illustrate attachment of a transparent adhesive layer 318 to the bottom surface of the LED chip 300 or formation of the transparent adhesive layer 318 on a target substrate 100 and in the pre-determined light-emitting region 100a according to various embodiments. Referring to FIG. 3A, in some embodiments, during the transfer of the LED chips 300 to the target substrate 100, the transparent adhesive layer 318 may be attached to the bottom surface of the LED chips 300. Referring to FIG. 3B, in other embodiments, the transparent adhesive layer 318 may be also directly formed in the pre-determined light-emitting region 100a and on the target substrate 100 prior to the transfer of the LED chips 300 to the target substrate 100.

In some embodiments, the material of the transparent adhesive layer 318 may include an organic material, such an organic polymer material. In some specific embodiments, the material of the transparent adhesive layer 318 may include a photoresist material. According to some embodiments, the transparent adhesive layer 318 may have a light transmittance to light with a wavelength in a range from 500 nm to 1100 nm greater than 90%, or preferably greater than 95%. In some embodiments, the thickness of the transparent adhesive layer 318 may be between about 2 µm and about 20 µm, such as about 10 µm.

Since the adhesion between the transparent adhesive layer 318, the target substrate 100 and/or the LEDs chip 300 may be greater than the adhesion between the LED chip 300 and the pickup device 401, the LED chips 300 may be detached from the pickup device 401 after the LED chips 300 are attached to the target substrate 100.

Figures 5A, 5B:
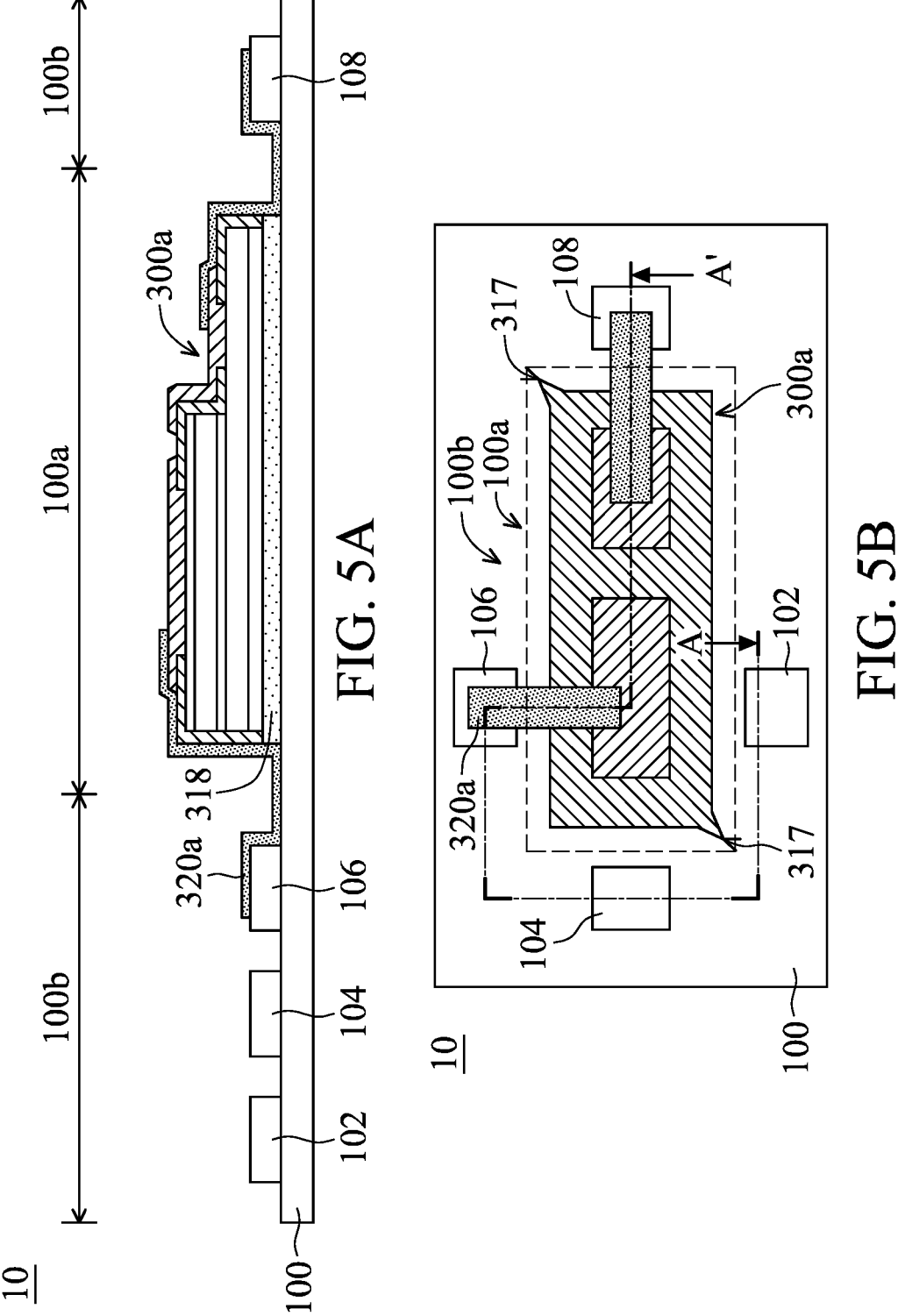
FIG. 5B illustrates a top view of a package structure at the intermediate stage of its forming process according to some embodiments.

Subsequently, FIGS. 4 and 5A illustrate cross-sectional views of the package structure 10 at the intermediate stages of its forming process according to some embodiments. As shown in FIG. 4, the LED chip 300 is transferred into the pre-determined light-emitting region 100a of the target substrate 100. In FIG. 4, the LED chip after the transfer may be also referred to as an LED chip 300a. In addition, as shown in FIG. 4, no matter which method is used to form the transparent adhesive layer 318, the transparent adhesive layer 318 may be sandwiched between the target substrate 100 and the LED chip 300a after transferring the LED chip 300a to the pre-determined light-emitting region 100a of the target substrate 100. In some embodiments, the projection planes of the LED chip 300a and the transparent adhesive layer 318 on the target substrate 100 may completely overlap. In addition, in FIG. 4, the projection area of the LED chip 300a on the target substrate 100 is illustrated to be the same as that of the transparent adhesive layer 318 on the target substrate 100. However, in other embodiments, the projection area of the LED chip 300a on the target substrate 100 may be greater than or less than that of the transparent adhesive layer 318 on the target substrate 100.

Next, referring to FIG. 5A, a redistribution layer 320a is formed on the LED chip 300a. The redistribution layer 320a extends from the pre-determined light-emitting region 100a of the target substrate 100 to the pre-determined non-light-emitting region 100b of the target substrate 100. Further-more, in some embodiment, in addition to forming on the LED chip 300a, the redistribution layer 320a may be con-formally formed on the sidewall of the LED chips 300a, on the target substrate 100, and on the electrodes 106 and the common electrode 108. According to some embodiments, the redistribution layer 320a may electrically connect the LED chip 300a to the electrode 106 and the common electrode 108.

The distribution layer in the package structure (and addi-tional redistribution layers formed subsequently) may real-ize the formation of high-density stacked LED chips directly on the target substrate (such as the backplane of the inter-poser substrate of the display device). The electrical con-nection of the LED chip may extend from the pre-deter-mined light-emitting region to the pre-determined non-light-emitting region in the package structure through the redistribution layer. Compared to the conventional package process that forms LED chips directly on a wafer, the process window and reliability of the resulting package structure may be increased.

According to some embodiments, the material of the redistribution layer 320a may include Al, Cu, W, Ti, Cr, Pt, Au, Ta, Ni, TiN, TaN, NiSi, CoSi, TaC, TaSiN, TaCN, TiAl, TiAlN, indium tin oxide (ITO), other suitable conductive materials, or a combination thereof, but the present disclo-sure is not limited thereto. The material of the redistribution layer 320a may be deposited using electro-plating, physical vapor deposition (PVD), atomic layer deposition (ALD), metalorganic chemical vapor deposition (MOCVD), other suitable deposition techniques, or a combination thereof. Next, a portion of the material of the redistribution layer 320a is removed using suitable etching processes to expose two electrodes of the LED chip 300a. Alternatively, in other embodiments, a patterned photoresist may be formed first to define a region in which the redistribution layer 320a is formed, and the material of the redistribution layer 320a may be deposited in this region to form a patterned redis-tribution layer 320a. Subsequently, the photoresist may be removed and further process steps may be performed.

Referring to FIG. 5B, FIG. 5B is a top view of the package structure 10 shown in FIG. 5A. FIG. 5A is taken along a line A-A' in FIG. 5B. It should be noted that although the LED chip 300 in the cross-sectional views of FIGS. 2D and 3A is illustrated to have only one tethered structure 317, the disclosure is not limited thereto. Each LED chip 300 may have at least one tethered structure 317. For example, as shown in FIG. 5B, in some other embodiments, the LED chip 300a (and other LED chips disposed later) may have more than one tethered structure 317, such as two tethered structures 317. In FIG. 5B, although the tethered structures 317 in the package structure 10 are illustrated to form on two ends of the LED chip 300a, the disclosure is not limited thereto. In other embodiments, the tethered structures 317 may be formed at any places on the outer edge of the LED chip 300a as long as the tethered structures 317 does not completely overlap the redistribution layer 320 from the top-view shown in FIG. 5B.

Figures 6, 7:
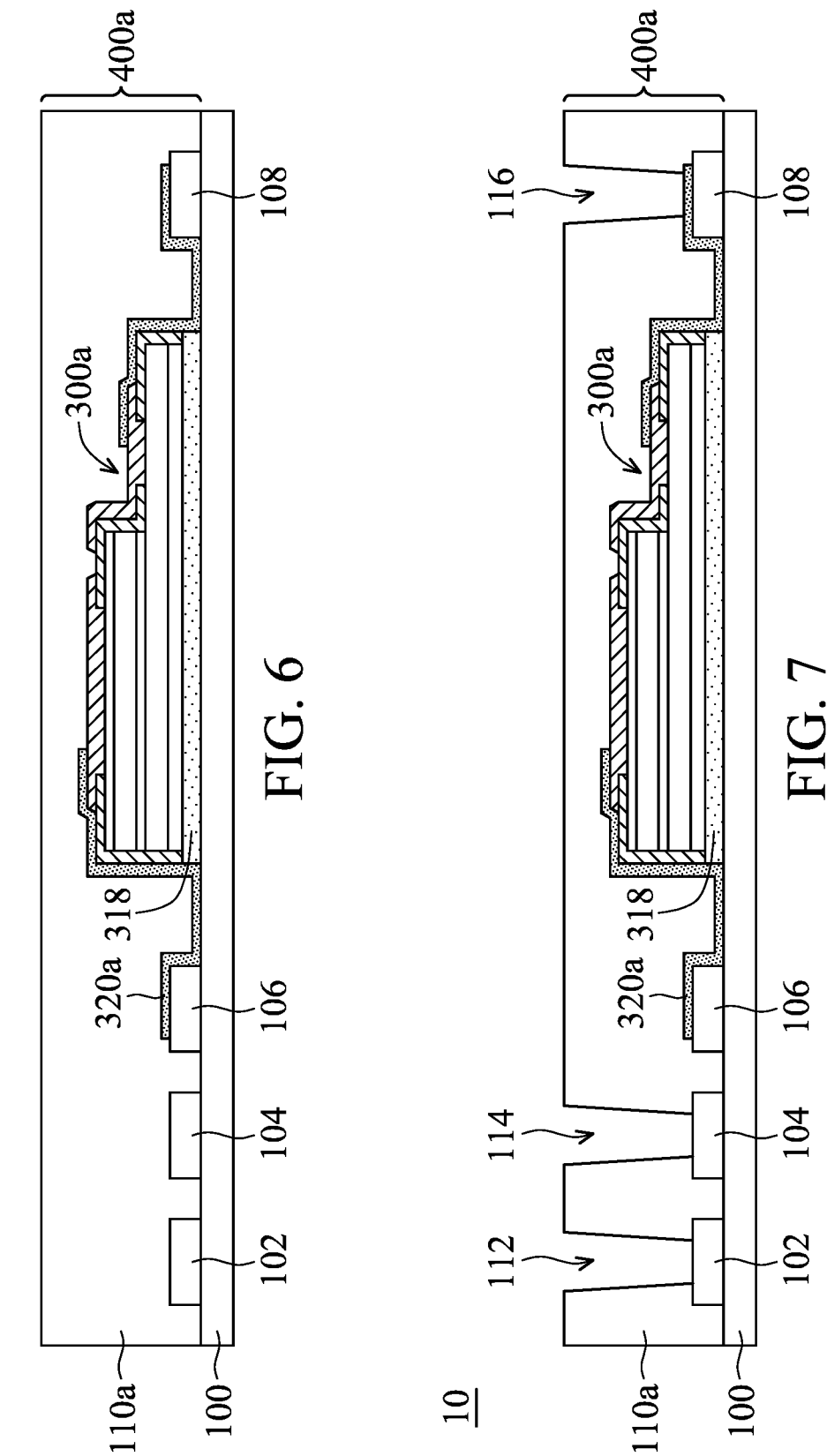
FIGS. 6-13 illustrate cross-sectional views of a package structure at the intermediate stages of its forming process according to some embodiments.

FIGS. 6-13 illustrate cross-sectional views of the package structure 10 at the intermediate stages of its forming process according to some embodiments. Referring to FIG. 6, after forming the redistribution layer 320a, a planarization layer 110a is formed on the LED chip 300a and the redistribution layer 320a. In particular, as shown in FIG. 6, the planariza-tion layer 110a is formed on the target substrate 100, the electrodes 102, 104, 106, the common electrode 108, the LED chip 300a, and the redistribution layer 320a. After forming the planarization layer 110a, the transparent adhe-sive layer 318, the LED chip 300a, the redistribution layer 320a and the planarization layer 110 may be collectively referred to as a first light-emitting layer 400a.

In accordance with some embodiments, the planarization layer 110a may be transparent. Specifically, the planariza-tion layer 110a may have a light transmittance to light with a wavelength in a range from 200 nm to 1100 nm greater than 90%, or preferably greater than 95%. In some embodi-ments, the material of the planarization layer 110a may include an organic material or an inorganic material. In some specific embodiments, the material of the planarization layer 110a may include an organic material. In some embodi-ments, the organic material may include photoresist or benzocyclobutene (BCB). In some embodiments, the inor-ganic material may include silicate glass or phosphor-sili-cate glass. The planarization layer 110a may be formed using any suitable deposition processes, such as a spin-on coating process, a chemical vapor deposition (CVD) process, a PVD process, an ALD process, other applicable deposition methods, or a combination thereof.

Next, referring to FIG. 7, a portion of the planarization layer 110 in the first light-emitting layer 400a is removed to form openings 112, 114, and 116 in the planarization layer 110a. The openings 112, 114, and 116 respectively expose the electrodes 102 and 104 and the redistribution layer 320a on the common electrode 108. The portion of the planarization layer 110a may be removed using any suitable methods. For example, in the embodiments where the planarization layer 110a includes an organic material such as photoresist, the portion of the planarization layer 110a may be removed using a photolithography process. In some embodiments, the photolithography process may include soft baking, hard baking, mask aligning, exposure, post-exposure baking (PEB), developing photoresist, rinsing, drying, and/or other suitable processes.

Figures 8, 9:
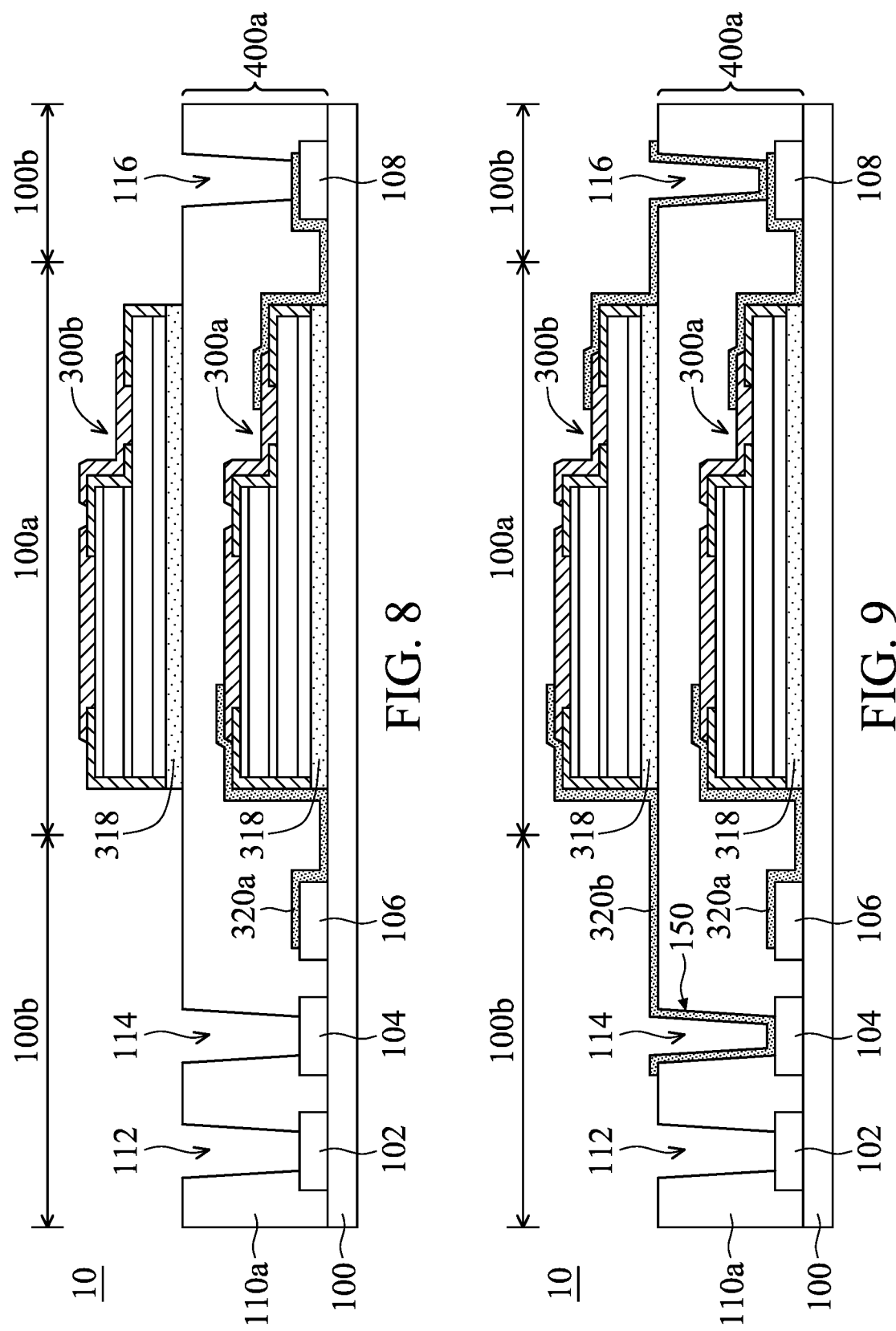

Referring to FIG. 8, an LED chip 300b is disposed on the planarization layer 110a of the first light-emitting layer 400a using the aforementioned method, and the transparent adhesive layer 318 is sandwiched between the planarization layer 110a and the LED chip 300b. It should be noted that the transparent adhesive layer 318 and the LED chip 300b are also disposed in the pre-determined light-emitting region 100a of the target substrate 100.

Next, referring to FIG. 9, a redistribution layer 320b is formed on the LED chip 300b. The redistribution layer 320b extends from the pre-determined light-emitting region 100a of the target substrate 100 to the pre-determined non-light-emitting region 100b of the target substrate 100. In addition, in some embodiments, in addition to forming on the LED chip 300b, the redistribution layer 320b may be conformally formed on the sidewall of the LED chip 300b and on the planarization layer 110a, and may further extend into the openings 114 and 116. According to some embodiments, as shown in FIG. 9, the redistribution layer 320b that extends into the openings 114 and 116 may be conformally formed on sidewalls and bottom surfaces of the openings 114 and 116. Moreover, the redistribution layer 320b that extends into the openings 114 and 116 may be respectively in physical contact with the electrode 104 and the redistribution layer 320a on the common electrode 108 so that the redistribution layer 320b may electrically connect the LED chip 300b to the electrode 104 and the common electrode 108. It should be noted that the portion of the redistribution layer 320b that extends into the opening 114 may be referred to as a via 150 herein. In some embodiments, as shown in FIG. 9, the via 150 may extend through the planarization layer 110a of the first light-emitting layer 400a. The material and the method for the redistribution layer 320b are similar to or the same as those for the redistribution layer 320a, which are not repeated herein.

Figure 10:
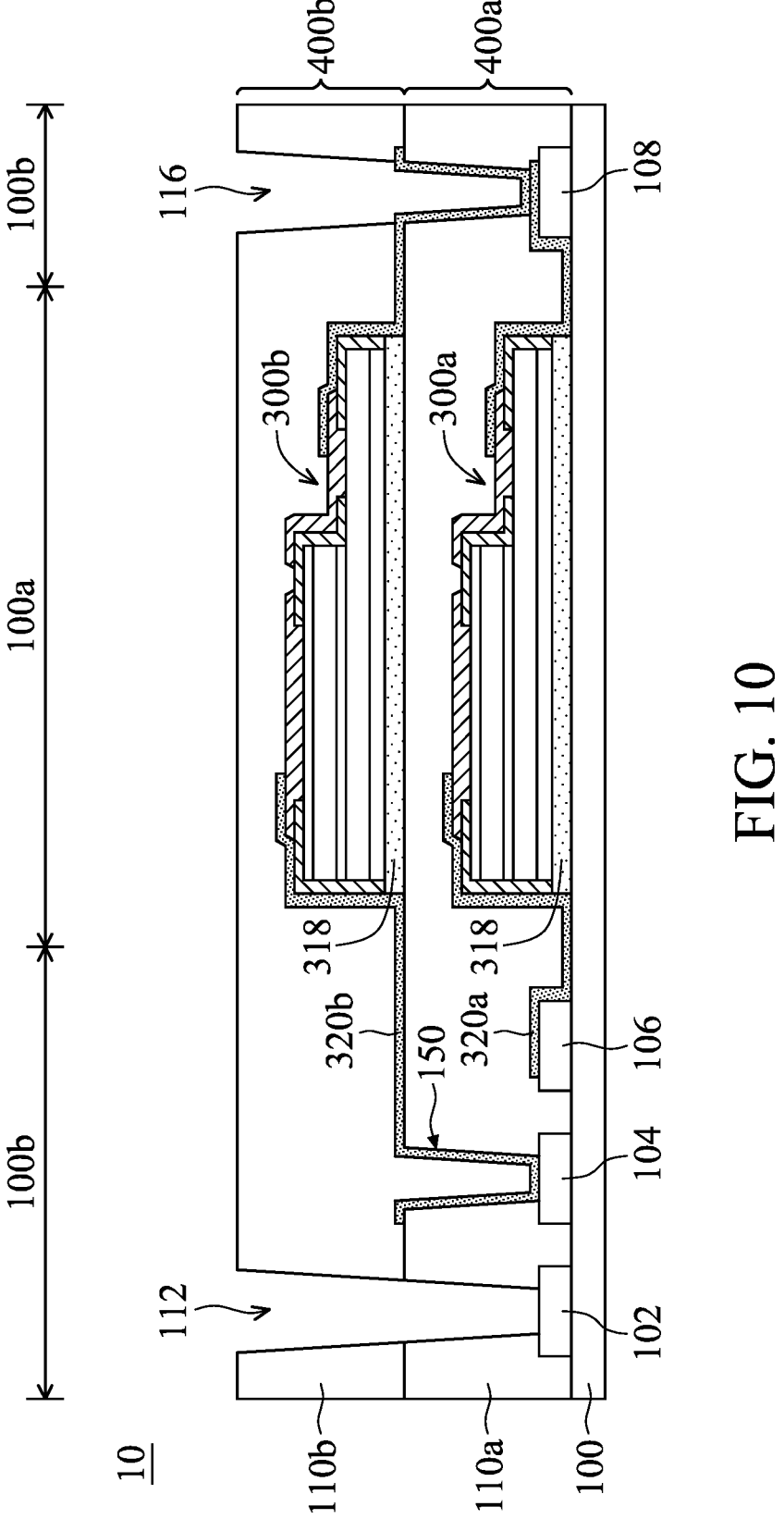

Next, referring to FIG. 10, after forming the redistribution layer 320b, a planarization layer 110b is formed on the LED chip 300b and the planarization layer 320a. In particular, as shown in FIG. 10, the planarization layer 110b is formed on the LED chip 300b and the redistribution layer 320b, and may further extend into and fill the space in the via 150 that is not filled with the redistribution layer 320b. In addition, the planarization layer 110b may further fill the openings 112 and 116. However, after forming the planarization layer 110b, the openings 112 and 116 may be formed again using the aforementioned method to remain the space for the subsequent formation of an additional redistribution layer. After forming the planarization layer 110b, the transparent adhesive layer 318, the LED chip 300b, the redistribution layer 320b, and the planarization layer 110b disposed on the first light-emitting layer 400a may be collectively referred to as a second light-emitting layer 400b.

Figure 11:
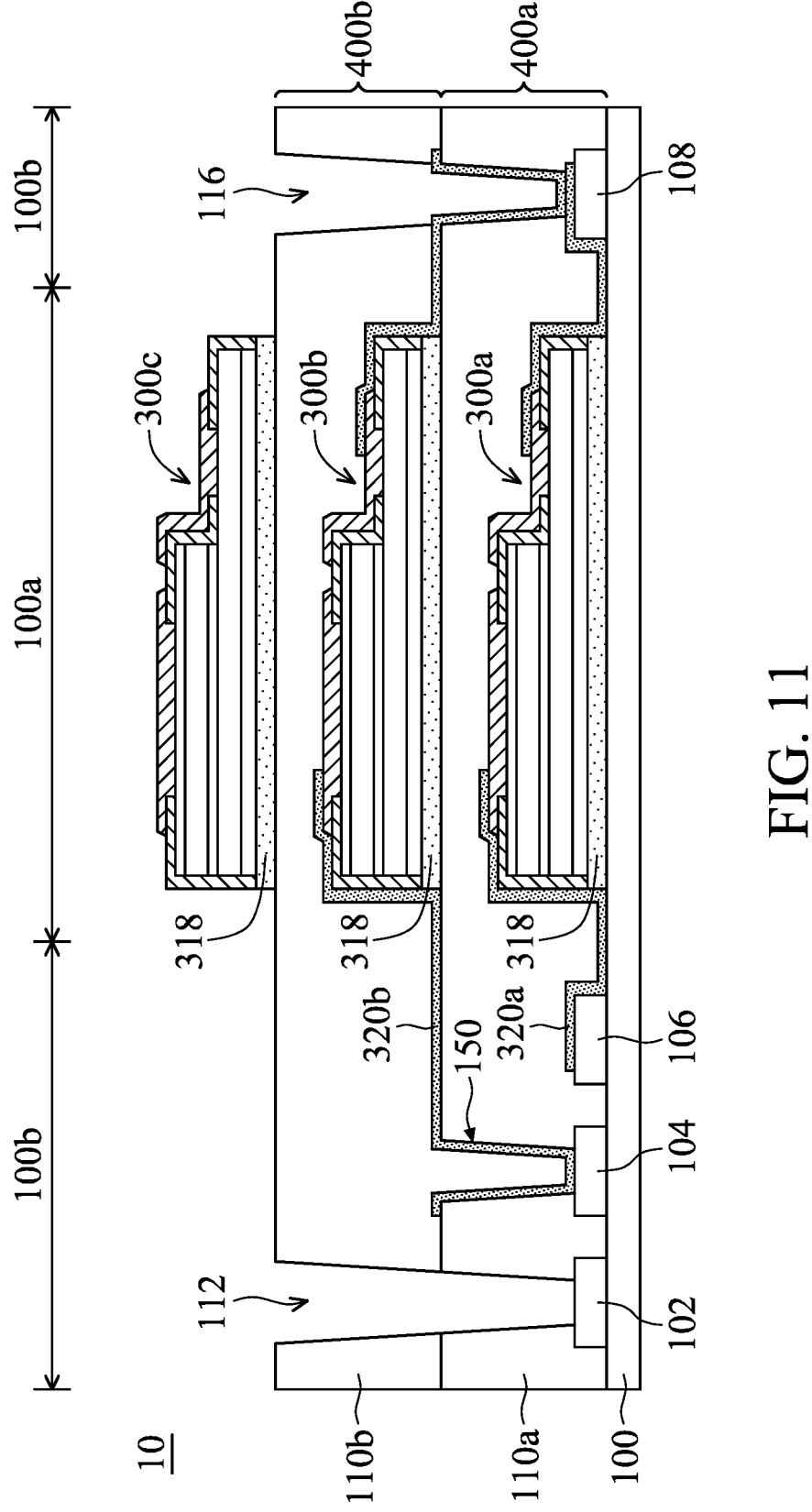

Next, referring to FIG. 11, similar steps to those shown in FIG. 8 are repeated. An LED chip 300c is disposed on the planarization layer 110b of the second light-emitting layer 400b, and the transparent adhesive layer 318 is sandwiched between the planarization layer 110b and the LED chip 300c. Likewise, the transparent adhesive layer 318 and LED chip 300c on the second light-emitting layer 400b are also disposed in the pre-determined light-emitting region 100a of the target substrate 100.

Figure 12:
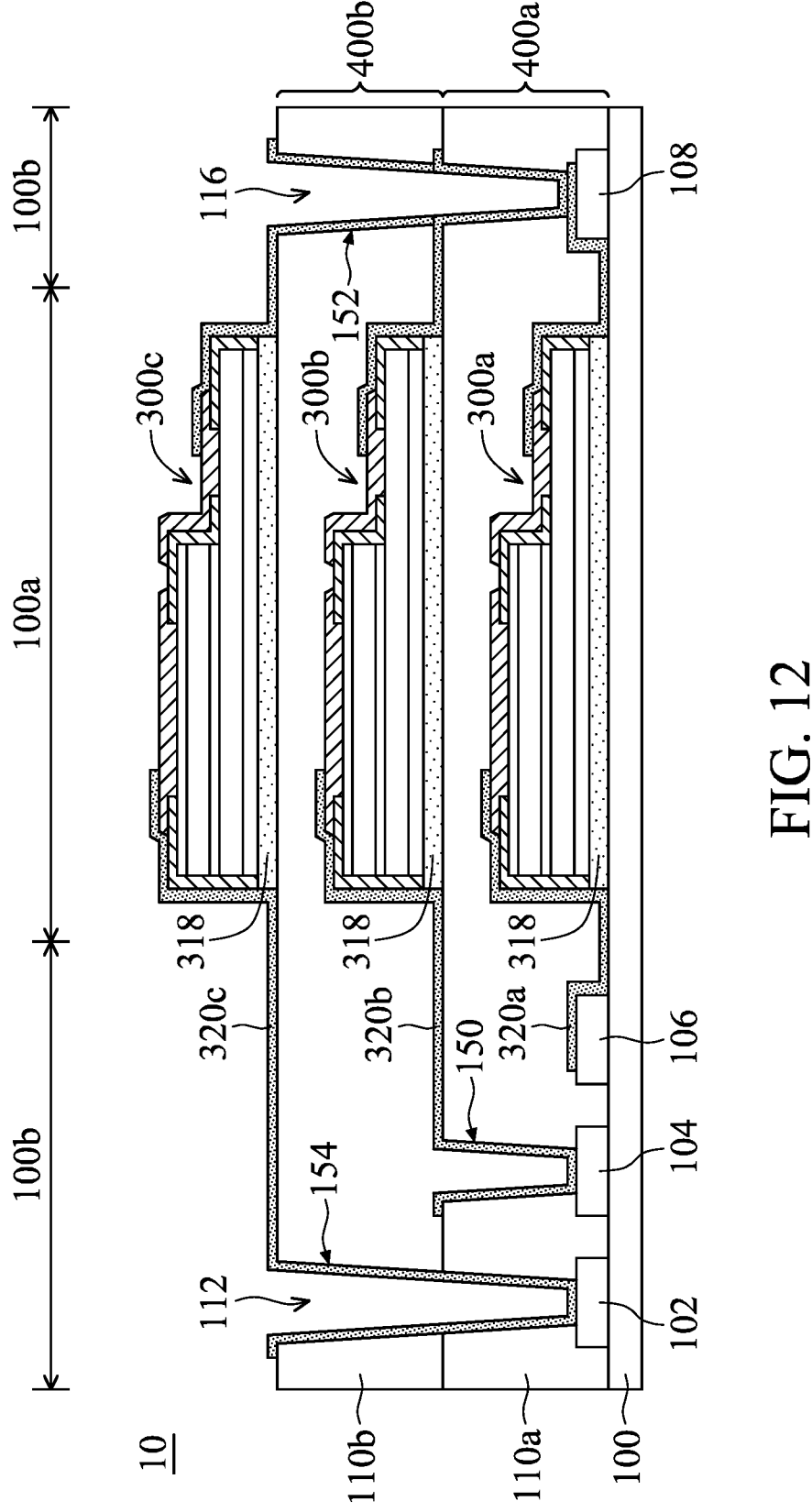

Referring to FIG. 12, similar steps to those shown in FIG. 9 are repeated. A redistribution layer 320c is formed on the LED chip 300c. The redistribution layer 320c extends from the pre-determined light-emitting region 100a of the target substrate 100 to the pre-determined non-light-emitting region 100b of the target substrate 100. In addition, in some embodiments, in addition to forming on the LED chip 300c, the redistribution layer 320c may be conformally formed on the sidewall of the LED chip 300c and on the planarization layer 110b, and may further extend into the openings 112 and 116. According to some embodiments, as shown in FIG. 12, the redistribution layer 320c that extends into the openings 112 and 116 may be conformally formed on sidewalls and bottom surfaces of the openings 112 and 116. Moreover, the redistribution layer 320c that extends into the openings 112 and 116 may be respectively in physical contact with the electrode 102 and the redistribution layer 320b in the opening 116 so that the redistribution layer 320c may electrically connect the LED chip 300c to the electrode 102 and the common electrode 108. It should be noted that the portions of the redistribution layer 320b and 320c that extend into the opening 116 may be referred to as a via 152 herein, and the portion of the redistribution layer 320c that extends into the opening 112 may be referred to as a via 154 herein. In some embodiments, as shown in FIG. 12, the vias 152 and 154 may extend through the planarization layer 110a of the first light-emitting layer 400a and the planarization layer 110b of the second light-emitting layer 400b.

Furthermore, according to some embodiments, the redistribution layer 320b may be electrically connected to the electrode 104 and the common electrode 108 through the vias 150 and 152, respectively, and the redistribution layer 320c may be electrically connected to the electrode 102 and the common electrode 108 through the vias 154 and 152, respectively. As shown in FIG. 12, the redistribution layer 320b of the second light-emitting layer 400b and the redistribution layer 320c may be electrically connected to the common electrode 108 through the same via 152. Accordingly, the number of electrically connected contacts formed on the target substrate 100 may be reduced.

Figure 13:
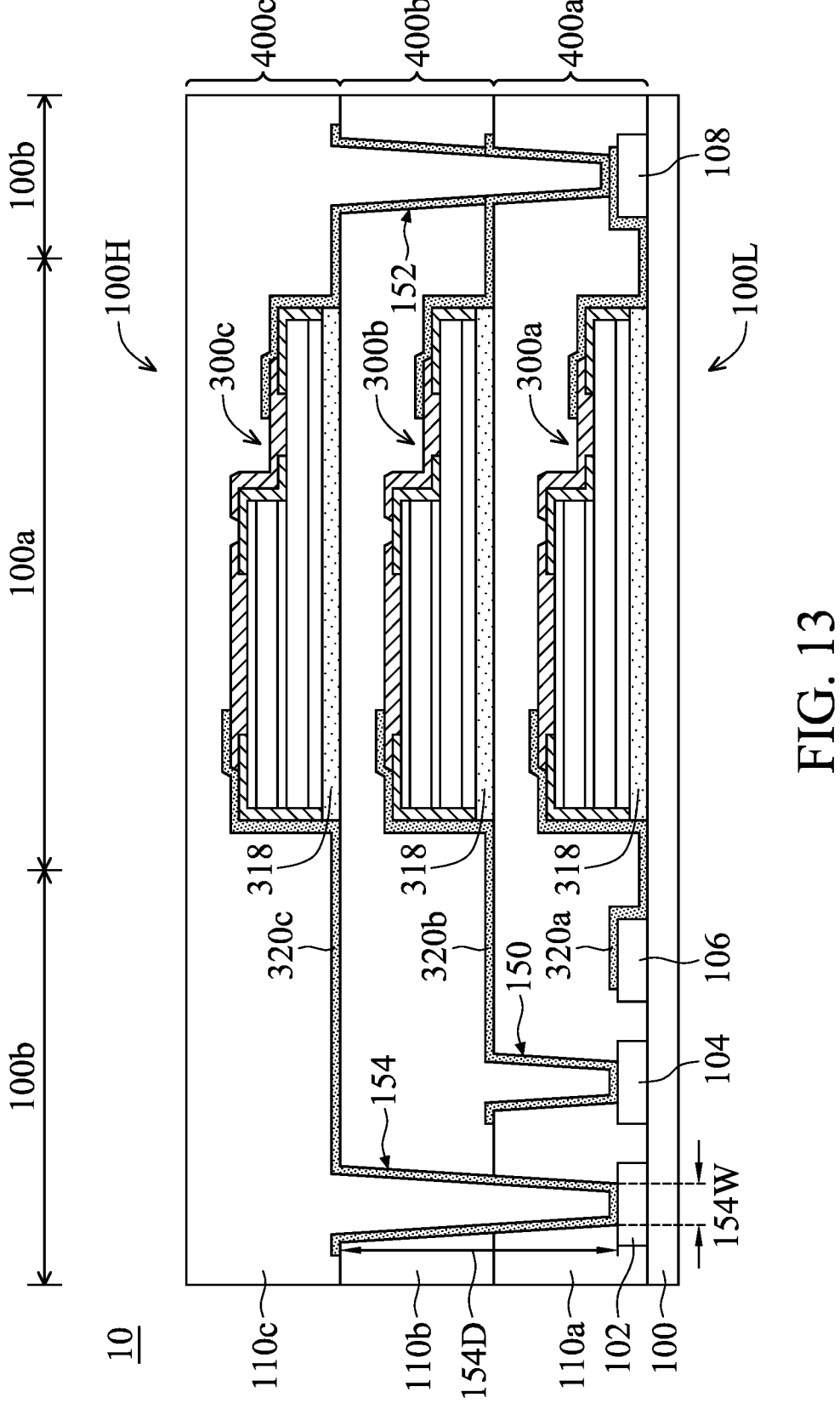

Referring to FIG. 13, in some embodiments, the ratio of a depth 154D of the via 154 to a width 154W (i.e., the minimal width) of the via 154 (aspect ratio) may be between about 2:1 and about 20:1. Similarly, in some embodiments, the via 152, which electrically connects the redistribution layers 320b and 320c to the common electrode 108, may have an aspect ratio (i.e., the ratio of the depth of the via 152 to the minimal width of the via 152) of about 2:1 to about 20:1. The vias 152 and 154 having the aspect ratio within the above range may reduce the space occupied by the vias in the package structure, thereby improving signal integrity of the LED chips in the package structure.

Next, referring again to FIG. 13, a planarization layer 110c is formed on the redistribution layer 320c and the LED chip 300c. In particular, the planarization layer 110c is formed on the redistribution layer 320*c*, the LED chip 300*c*, and the planarization layer 110*b* of the second light-emitting layer 400*b*, and may further extend into and fill the space in the vias 152 and 154 that is not filled by the redistribution layer 320*c*. After forming the planarization layer 110*c*, the transparent adhesive layer 318, the LED chip 300*c*, the redistribution layer 320*c*, and the planarization layer 110*c* disposed on the second light-emitting layer 400*b* may be collectively referred to as a third light-emitting layer 400*c*.

In some embodiments, the LED chip 300*a* of the first light-emitting layer 400*a* may emit light with a first wavelength, the LED chip 300*b* of the second light-emitting layer 400*b* may emit light with a second wavelength, and the LED chip 300*c* of the third light-emitting layer 400*c* may emit light with a third wavelength. The first wavelength, the second wavelength, and the third wavelength are different from one another. Moreover, as described above, in some embodiments, each of the LED chips 300*a*, 300*b*, and 300*c* may be a blue light, green light, or red light LED chip.

In FIG. 13, in accordance with some embodiments, a first side 100H of the target substrate 100 on which the first light-emitting layer 400*a*, the second light-emitting layer 400*b*, and the third light-emitting layer 400*c* are disposed may be defined as the light-emitting side of the package structure 10. In these embodiments, the first wavelength of the light emitted by the LED chip 300*a* is greater than the second wavelength of the light emitted by the LED chip 300*b*, and the second wavelength of the light emitted by the LED chip 300*b* is greater than the third wavelength of the light emitted by the LED chip 300*c*. For example, in these embodiments, the LED chips 300*a*, 300*b*, and 300*c* may be a red light LED chip, a green light LED chip, and a blue light LED chip, respectively.

When the first side 100H shown in FIG. 13 is the light-emitting side, the light emitted by the LED chip located at the lower layer (such as the LED chip 300*a* of the first light-emitting layer 400*a*) may have a longer wavelength, and the light emitted by the LED chip located at the upper layer (such as the LED chip 300*c* of the third light-emitting layer 400*c*) may have a shorter wavelength. This way, the light emitted by the LED chip in the upper light-emitting layer may be prevented from passing through the lower light-emitting layers, and the light emitted by the LED chips in the lower layers may not be affected accordingly.

However, in other embodiments, a second side 100L of the target substrate 100 on which the first light-emitting layer 400*a*, the second light-emitting layer 400*b*, and the third light-emitting layer 400*c* are not disposed may be also defined as the light-emitting side of the package structure 10. The second side 100L is opposite to the first side 100H. In these embodiments, the third wavelength of the light emitted by the LED chip 300*c* is greater than the second wavelength of the light emitted by the LED chip 300*b*, and the second wavelength of the light emitted by the LED chip 300*b* is greater than the first wavelength of the light emitted by the LED chip 300*a*. For example, in these embodiments, the LED chips 300*a*, 300*b*, and 300*c* may be a blue light LED chip, a green light LED chip, and a red light LED chip, respectively.

When the second side 100L shown in FIG. 13 is the light-emitting side, the light emitted by the LED chip located at the upper layer (such as the LED chip 300*c* of the third light-emitting layer 400*c*) may have a longer wavelength, and the light emitted by the LED chip located at the lower layer (such as the LED chip 300*a* of the first light-emitting layer 400*a*) may have a shorter wavelength. This way, the light emitted by the LED chip in the lower light-emitting layer may be prevented from passing through the upper light-emitting layers, and the light emitted by the LED chips in the upper layers may not be affected accordingly.

As shown in FIG. 13, according to some embodiments of the disclosure, the package structure 10 has a light-emitting region 100*a* (i.e., the pre-determined light-emitting region 100*a* described above) and a non-light-emitting region 100*b* (i.e., the pre-determined non-light-emitting region 100*b* described above) that is adjacent to the light-emitting region 100*a*. The package structure 10 includes a substrate 100 (i.e., the target substrate 100 described above) and the first light-emitting layer 400, the second light-emitting layer 400*b*, and the third light-emitting layer 400*c* that are sequentially stacked. Each of the first light-emitting layer 400, the second light-emitting layer 400*b*, and the third light-emitting layer 400*c* includes the transparent adhesive layer 318, the LED chip (the LED chip 300*a*, 300*b*, or 300*c*) on the transparent adhesive layer 318, the redistribution layer (the redistribution layer 320*a*, 320*b*, or 320*c*) on the LED chip and extending from the light-emitting region 100*a* to the non-light-emitting region 100*b*, and the planarization layer (the planarization layer 110*a*, 110*b*, or 110*c*) on the LED chip and the redistribution layer.

In the embodiments shown in FIGS. 1, 2A-2D, 3A-3B, 4, 5A-5B, and 6-13, respective LED chips may be formed on the source wafer, and the LED chips may be stacked vertically on the target substrate. As such, LED chips emitting light with different colors may be disposed along the vertical direction in the package structure to reduce the area of a single pixel in the display device. Furthermore, the LED chip is attached to the target substrate and the planarization layer in the light-emitting layer through the transparent adhesive layer. It is unnecessary to bond an LED chip to another LED chip, and thus the process complexity of the package structure may be reduced. On the other hand, the method for forming the package structure provided by the disclosure includes transferring a single LED chip or LED chips with a certain period from a source wafer to a target substrate. The non-transferred LED chips may remain for the next process. This way, space utilization of the source wafer may be increased, the process of the package structure may be simplified, and the yield of the package structure may be improved.

Figure 14:
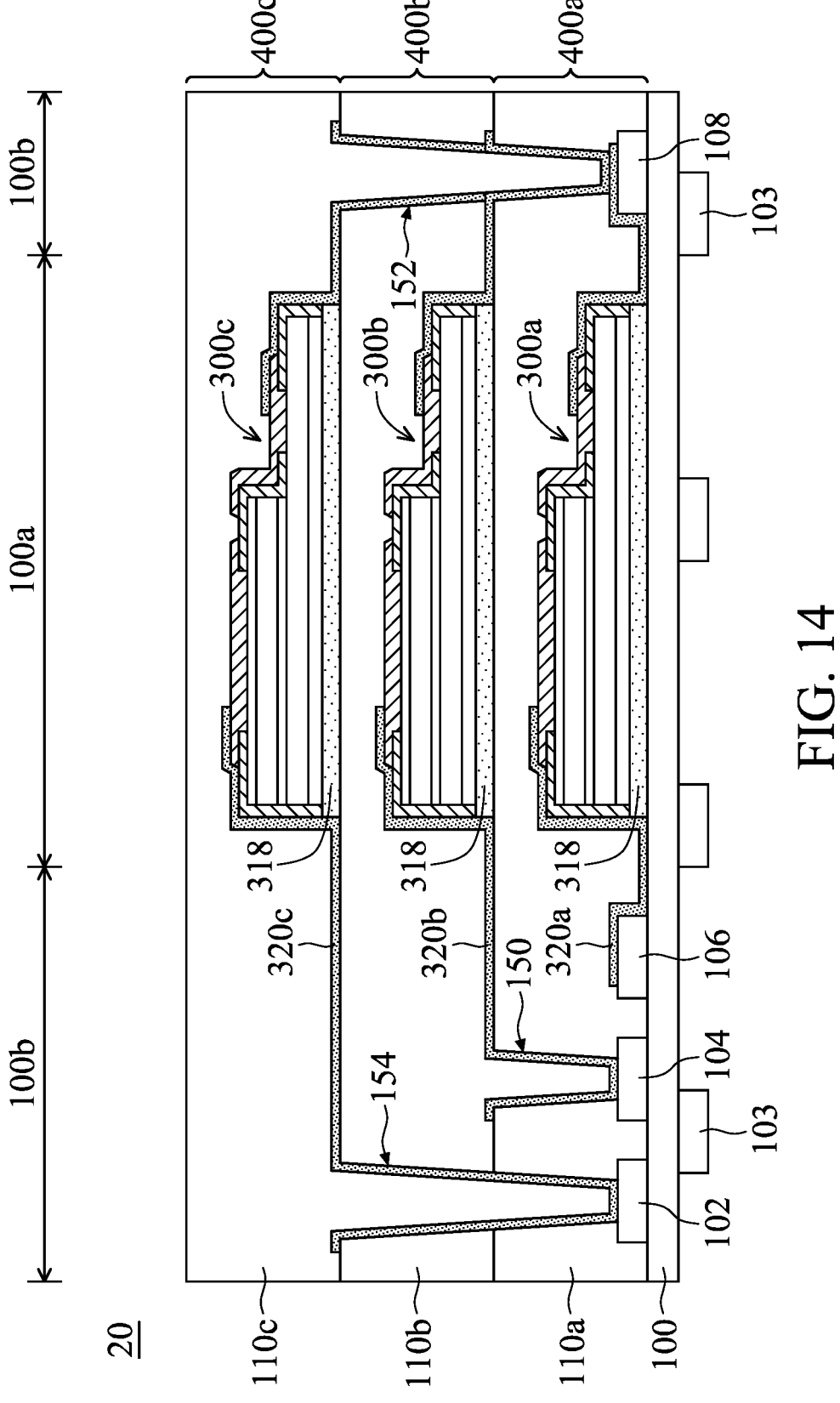
FIG. 14 is a cross-sectional view of a package structure according to other embodiments.

FIG. 14 is a cross-sectional view of a package structure 20 according to other embodiments. The package structure 20 shown in FIG. 14 is similar to the package structure 10 shown in FIG. 13, except that an interposer substrate (substrate 100) is used as a base structure for the package structure 20. In this embodiment, apart from the substrate 100 that is used as the interposer substrate, the package structure 20 may further include a conductive structure 103 disposed below the substrate 100. As described above, the substrate 100, which is used as the interposer substrate, may include multiple metal wire layers and a plurality of vias that connect every metal wire layer although the vias are not shown in FIG. 14. The package structure 20 may be electrically connected to another target substrate (such as another backplane of a display device) through the substrate 100 and the conductive structure 103. In some embodiments, the material of the conductive structure 103 may include any suitable conductive materials, such as Al, Cu, W, Ti, Cr, Pt, Au, Ta, Ni, TiN, TaN, NiSi, CoSi, TaC, TaSiN, TaCN, TiAl, TiAlN, indium tin oxide (ITO), other suitable conductive materials, or a combination thereof. According to the embodiment shown in FIG. 14, the package structure 20 may be used as a minimal unit and transferred to another target substrate to adjust the pixel density and the resolution of the display device at any time, thereby enhancing process flexibility.

Figure 15:
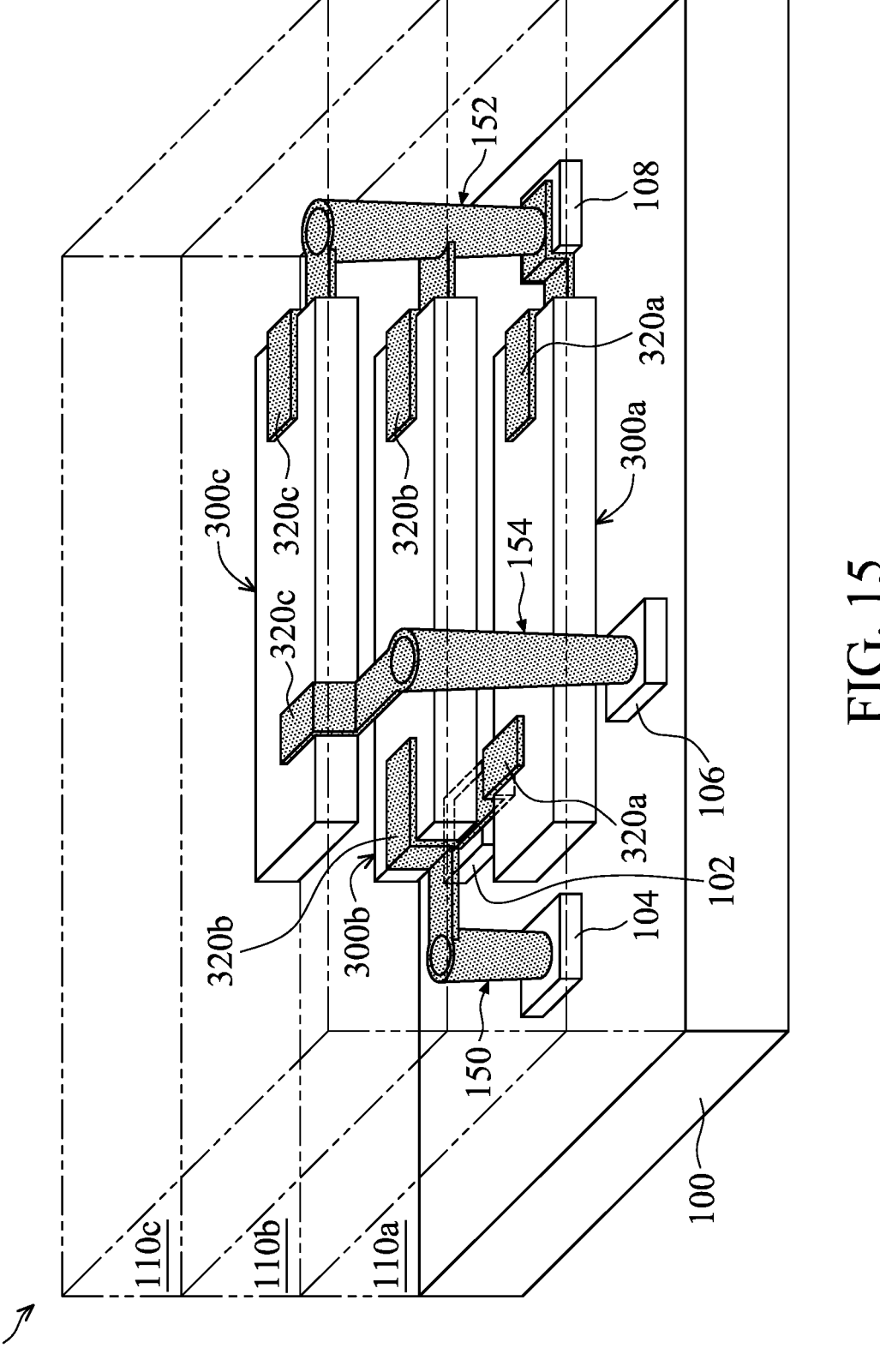
FIGS. 15 and 16A are perspective views of package structures according to various embodiments.

FIG. 15 is a perspective view of the package structure 10 according to some embodiments. In the package structure 10 shown in FIG. 15, although the redistribution layer 320*b* and 320*c* may be electrically connected to the common electrode 108 through the same via 152, the disclosure is not limited thereto. In other embodiments, the redistribution layer 320*b* and 320*c* may be electrically connected to the common electrode 108 through respective vias. These vias are also disposed in the aforementioned non-light-emitting region of the substrate 100, extending through the planarization layers 110*a* and 110*b*. The arrangement of the vias used for electrically connecting the redistribution layers 320*b* and 320*c* is not particularly limited as long as these vias are also disposed in the aforementioned non-light-emitting region of the substrate 100 and are electrically connected to the common electrode 108.

In addition, in some embodiments, the projection planes of the LED chips 300*a*, 300*b*, and 300*c* on the substrate 100 at least partially overlap. In some specific embodiments, as shown in FIG. 15, the projection planes of the LED chips 300*a*, 300*b*, and 300*c* on the substrate 100 completely overlap.

Figure 16A:
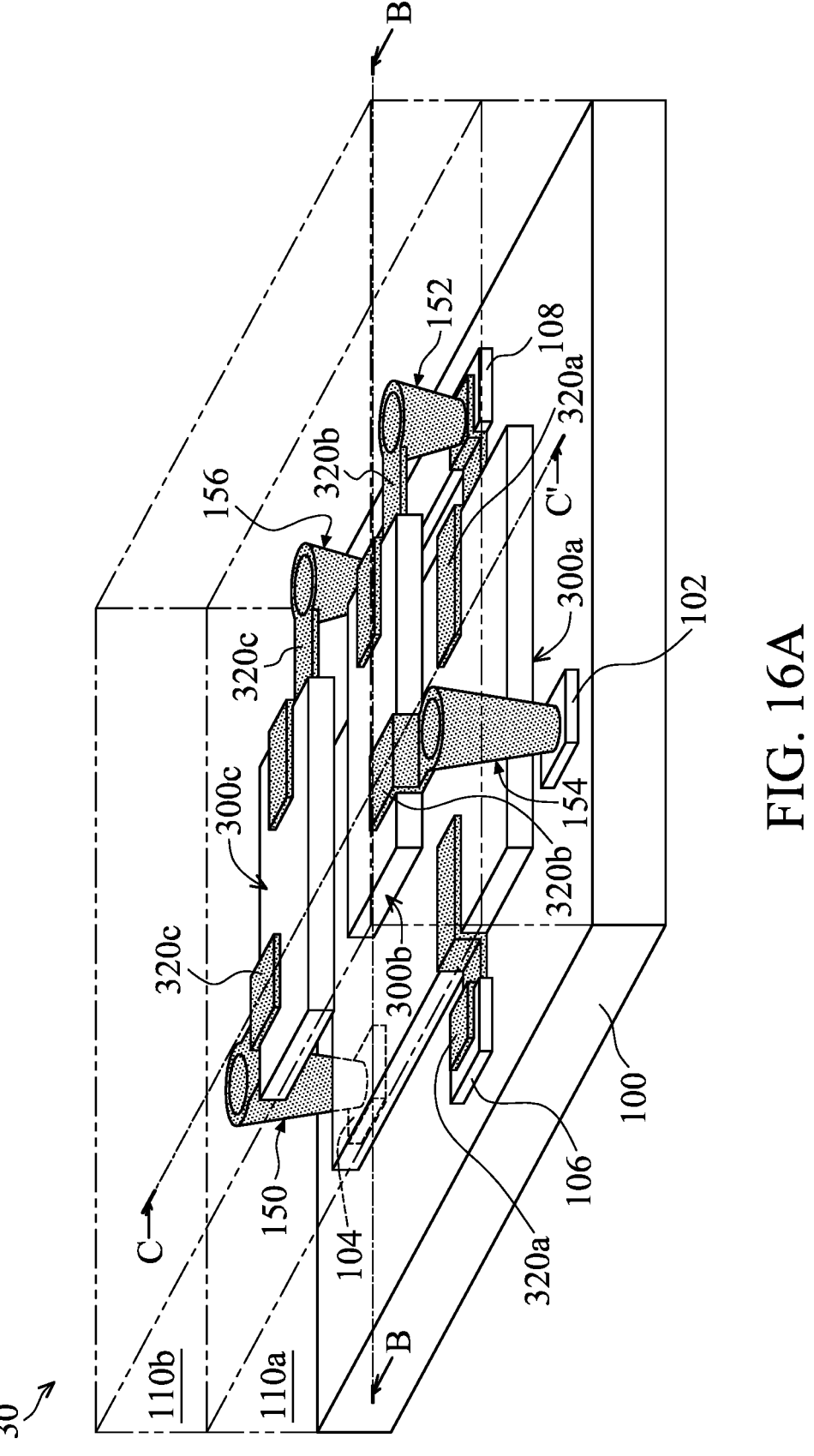

FIG. 16A is a perspective view of the package structure 30 according to some embodiments. It should be understood that, in FIG. 16A, the elements and/or features with the same reference numerals as those in the aforementioned embodiments may include the same materials, and like processes may be used to form these elements and/or features, which are not repeated herein. The difference between the package structure 30 shown in FIG. 16A and the package structure 10 shown in FIG. 15 is that the package structure 30 includes two planarization layers (the planarization layers 110*a* and 110*b*). The LED chip 300*a* is disposed in the planarization layer 110*a*, and the LED chips 300*b* and 300*c* are disposed in the planarization layer 110*b*.

In some embodiments, as shown in FIG. 16A, the LED chips 300*b* and 300*c* may be stacked above the LED chip 300*a*. In some embodiments, the size of the LED chip 300*a* may be greater than the size of the LED chip 300*b* or 300*c*. Specifically, according to some embodiments, the projection area of the LED chip 300*a* on the substrate 100 may be greater than the projection area of the LED chip 300*b* or 300*c* on the substrate 100. Furthermore, the projection area of the LED chip 300*a* on the substrate 100 may be greater than the sum of the projection areas of the LED chips 300*b* and 300*c* on the substrate 100.

In accordance with some embodiments, each projection plane of the LED chips 300*b* and 300*c* on the substrate 100 at least partially overlaps the projection plane of the LED chip 300*a* on the substrate 100. In some specific embodiments, each projection plane of the LED chips 300*b* and 300*c* on the substrate 100 completely overlaps the projection plane of the LED chip 300*a* on the substrate 100.

Figure 16B:
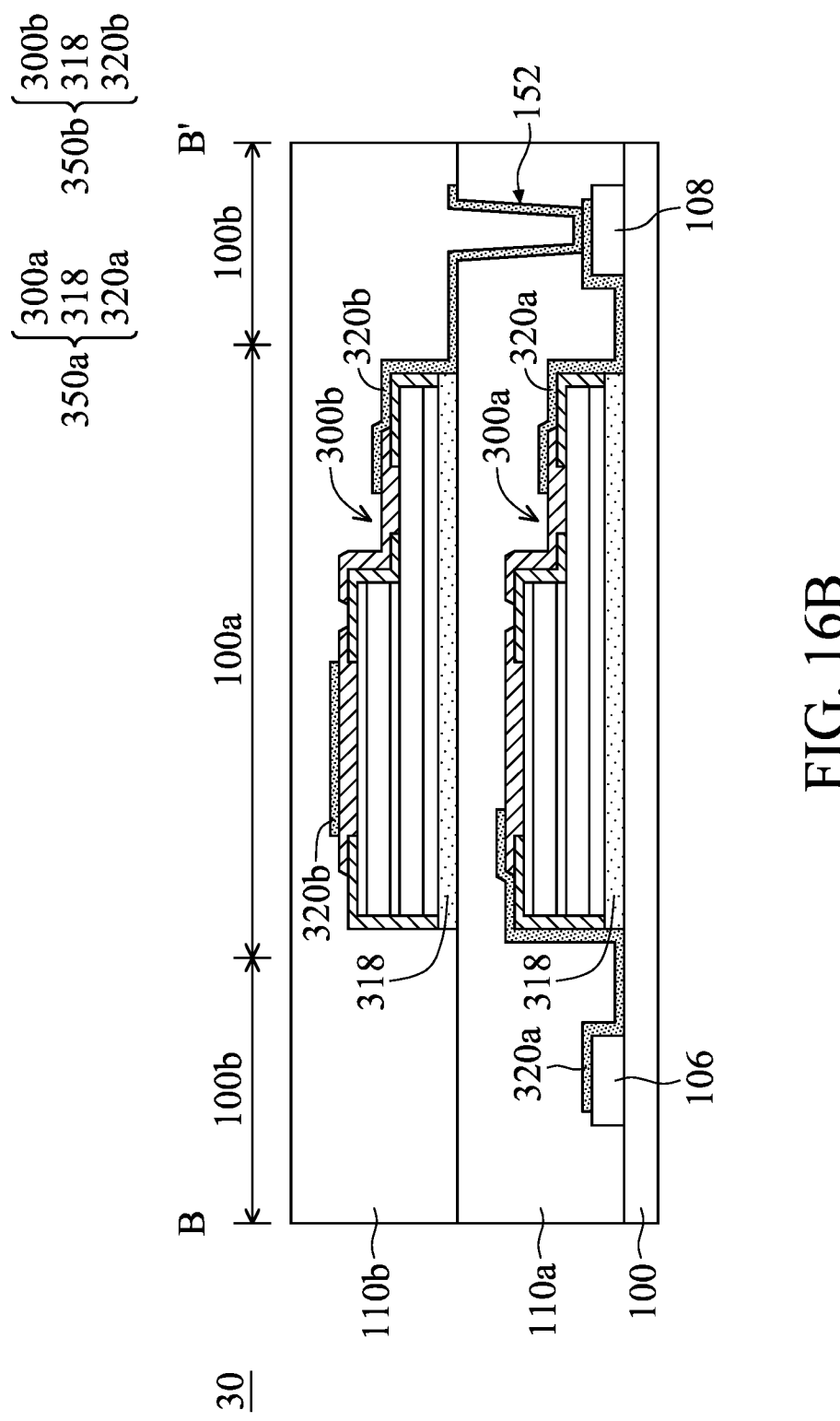
FIGS. 16B and 16C illustrate cross-sectional views of the package structure respectively taken along lines B-B' and C-C' in FIG. 16A according to some embodiments.
Figure 16C:
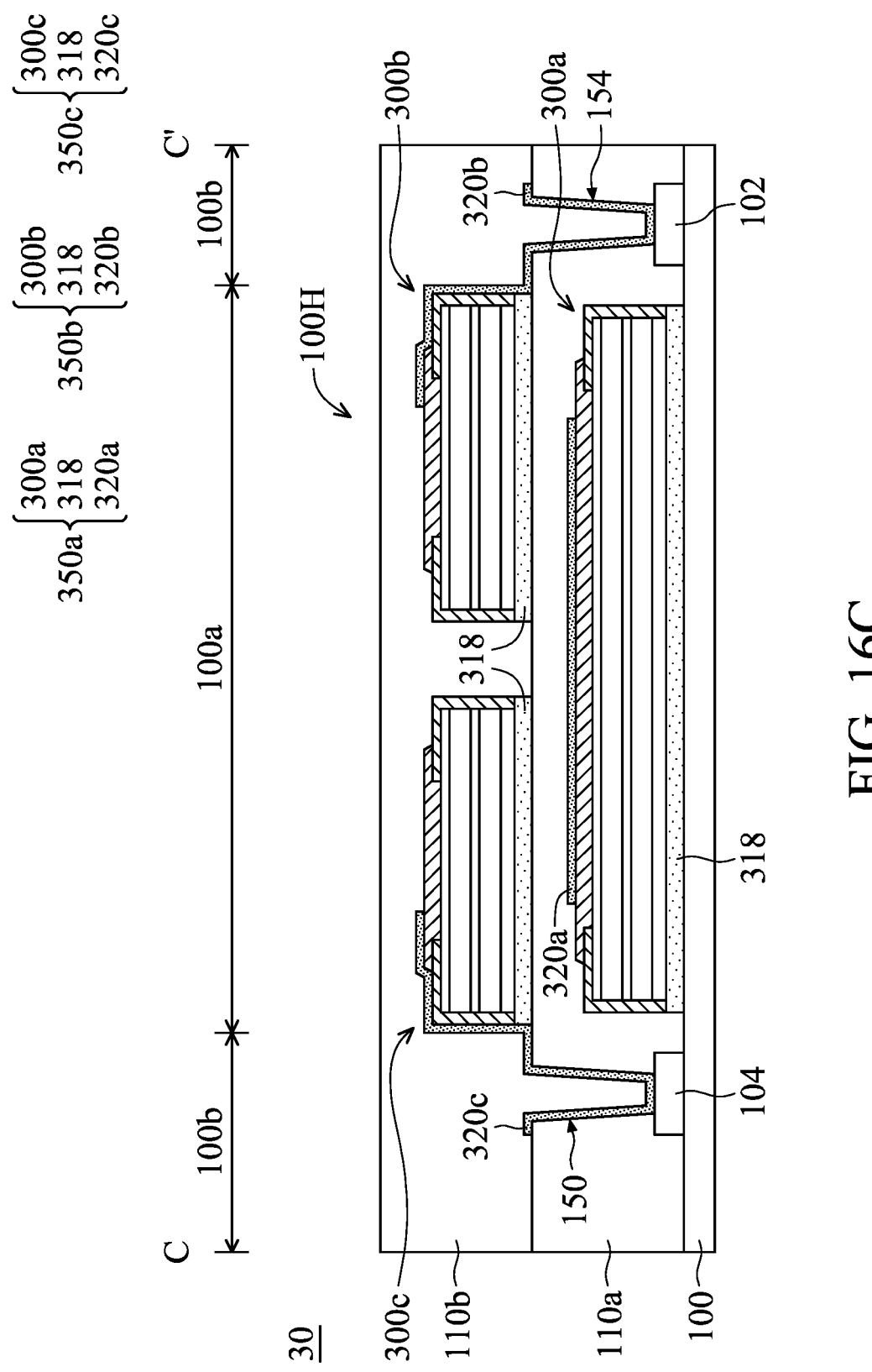

FIGS. 16B and 16C illustrate cross-sectional views of the package structure 30 respectively taken along lines B-B' and C-C' in FIG. 16A according to some embodiments. Referring to FIGS. 16B and 16C, according to some embodiments of the disclosure, the transparent adhesive layer 318 on the substrate 100, the LED chip 300*a*, and the redistribution layer 320*a* may be collectively referred to as a first light-emitting unit 350*a*. The transparent adhesive layer 318 on the planarization layer 110*a*, the LED chip 300*b*, and the redistribution layer 320*b* may be collectively referred to as a second light-emitting unit 350*b*. The transparent adhesive layer 318 on the planarization layer 110*a*, the LED chip 300*c*, and the redistribution layer 320*c* may be collectively referred to as a third light-emitting unit 350*c*.

In particular, the package structure 30 includes the substrate 100, the first light-emitting unit 350*a* on the substrate 100, the planarization layer 110*a* on the first light-emitting unit 350*a*, the second light-emitting unit 350*b*, the third light-emitting unit 350*c*, and the planarization layer 110*b* disposed on the second light-emitting unit 350*b* and the third light-emitting unit 350*c*. As described above, the first light-emitting unit 350*a*, the second light-emitting unit 350*b*, and the third light-emitting unit 350*c* include the transparent adhesive layer 318 disposed in the light-emitting region 100*a* of the substrate 100, the LED chips 300*a*, 300*b*, and 300*c* disposed on the transparent adhesive layer 318, and the redistribution layers 320*a*, 320*b*, and 320*c*. The light-emitting unit 350*b* and the light-emitting unit 350*c* are disposed on the planarization layer 110*a* and laterally separated from each other. As shown in FIGS. 16A-16C, the redistribution layer 320*a*, 320*b*, and 320*c* of the first light-emitting unit 350*a*, the second light-emitting unit 350*b*, and the third light-emitting unit 350*c* are respectively formed on the LED chips 300*a*, 300*b*, and 300*c*, and extend from the light-emitting region 100*a* of the substrate 100 to non-light-emitting region 100*b* of the substrate 100.

According to some embodiments, as shown in FIGS. 16A-16C, the package structure 30 may further include the electrode 102, 104, and 106 and the common electrode 108. The electrode 102, 104, and 106 and the common electrode 108 are disposed in the non-light-emitting region 100*b* of the substrate 100, and are in physical contact with the substrate 100. In some embodiments, the redistribution layer 320*a* of the first light-emitting unit 350*a* may electrically connect the LED chip 300*a* to the electrode 106 and the common electrode 108. In some embodiments, the redistribution layer 320*b* of the second light-emitting unit 350*b* may electrically connect the LED chip 300*b* to the electrode 102 and the common electrode 108. In some embodiments, the redistribution layer 320*c* of the third light-emitting unit 350*c* may electrically connect the LED chip 300*c* to the electrode 104 and the common electrode 108.

In addition, in some embodiments, as shown in FIGS. 16A-16C, the redistribution layer 320*b* of the second light-emitting unit 350*b* may be electrically connected to the common electrode 108 and the electrode 102 respectively through the vias 152 and 154, and the redistribution layer 320*c* of the third light-emitting unit 350*c* may be electrically connected to the electrode 104 and the common electrode 108 respectively through the vias 150 and 156. In some embodiments, all of the vias 150, 152, 154, and 156 are disposed in the non-light-emitting region 100*b* of the substrate 100, and extend through the planarization layer 110*a*. In accordance with some embodiments, the vias 150, 152, 154, and 156 may have an aspect ratio of about 2:1 to about 20:1 (i.e., a ratio of the depth of the via 150, 152, 154, or 156 to the minimal width of the via 150, 152, 154, or 156). The vias 150, 152, 154, and 156 having the aspect ratio within the above range may reduce the space occupied by the vias in the package structure, thereby improving signal integrity of the LED chips in the package structure.

In FIGS. 16A-16C, although the redistribution layer 320*b* of the second light-emitting unit 350*b* and the redistribution layer 320*c* of the third light-emitting unit 350*c* are electrically connected to the same common electrode 108 respectively through the vias 152 and 156, the disclosure is not limited thereto. In other embodiments, the redistribution layer 320*b* of the second light-emitting unit 350*b* and the redistribution layer 320*c* of the third light-emitting unit 350*c* may extend to the same via (not shown), and may be electrically connected to the common electrode 108 through this via. Similarly, this via may be disposed in the non-light-emitting region 100*b* of the substrate 100, and may extent through the planarization layer 110*a*.

Moreover, in some embodiments, as shown in FIG. 16C, a first side 100H of the substrate 100 on which the first light-emitting unit 350*a*, the second light-emitting unit 350*b*, and the third light-emitting unit 350*c* are disposed may be defined as the light-emitting side of the package structure 30. In some embodiments, the LED chip 300*a* of the first light-emitting unit 350*a* may emit light with a first wavelength, the LED chip 300*b* of the second light-emitting unit 350*b* may emit light with a second wavelength, and the LED chip 300*c* of the light-emitting unit 350*c* may emit light with a third wavelength. The first wavelength, the second wavelength, and the third wavelength may be different from one another.

In the embodiments where the first side 100H is the light-emitting side of the package structure 30, the first wavelength of the light emitted by the LED chip 300*a* may be greater than the second wavelength of the light emitted by the LED chip 300*b* and the third wavelength of the light emitted by the LED chip 300*c*. The second wavelength and the third wavelength are different. For example, in some embodiments, the LED chips 300*a* may be a red light LED chip and the LED chips 300*b* and 300*c* may respectively be a green light LED chip and a blue light LED chip, or the LED chips 300*b* and 300*c* may respectively be a blue light LED chip and a green light LED chip.

When the first side 100H is used as the light-emitting side of the package structure 30, the light emitted by the LED chips 300*b* and 300*c* of the second light-emitting unit 350*b* and the third light-emitting unit 350*c* may have shorter wavelength than that emitted by the LED chip 300*a* of the first light-emitting unit 350*a*. This way, the light emitted by the LED chips 300*b* and 300*c* of the second light-emitting unit 350*b* and the third light-emitting unit 350*c* may be prevented from passing through the underlying planarization layer 110*a*, and the light emitted by the LED chip 300*a*, which is below the LED chips 300*b* and 300*c*, may not be affected accordingly.

According to the embodiments shown in FIGS. 16A-16C, the LED chips with a smaller size (such as the LED chips 300*b* and 300*c* of the second light-emitting unit 350*b* and the third light-emitting unit 350*c*) are vertically stacked above the LED chip with a bigger size (such as the LED chip 300*a* of the first light-emitting unit 350*a*), and the LED chips with a smaller size are laterally separated from each other. In addition to the advantages described in the aforementioned embodiments, the package structure with the stacked LED chips may have a smaller overall size (such as a smaller height), thereby reducing the thickness of the display device in which this package structure is disposed.

Figure 17:
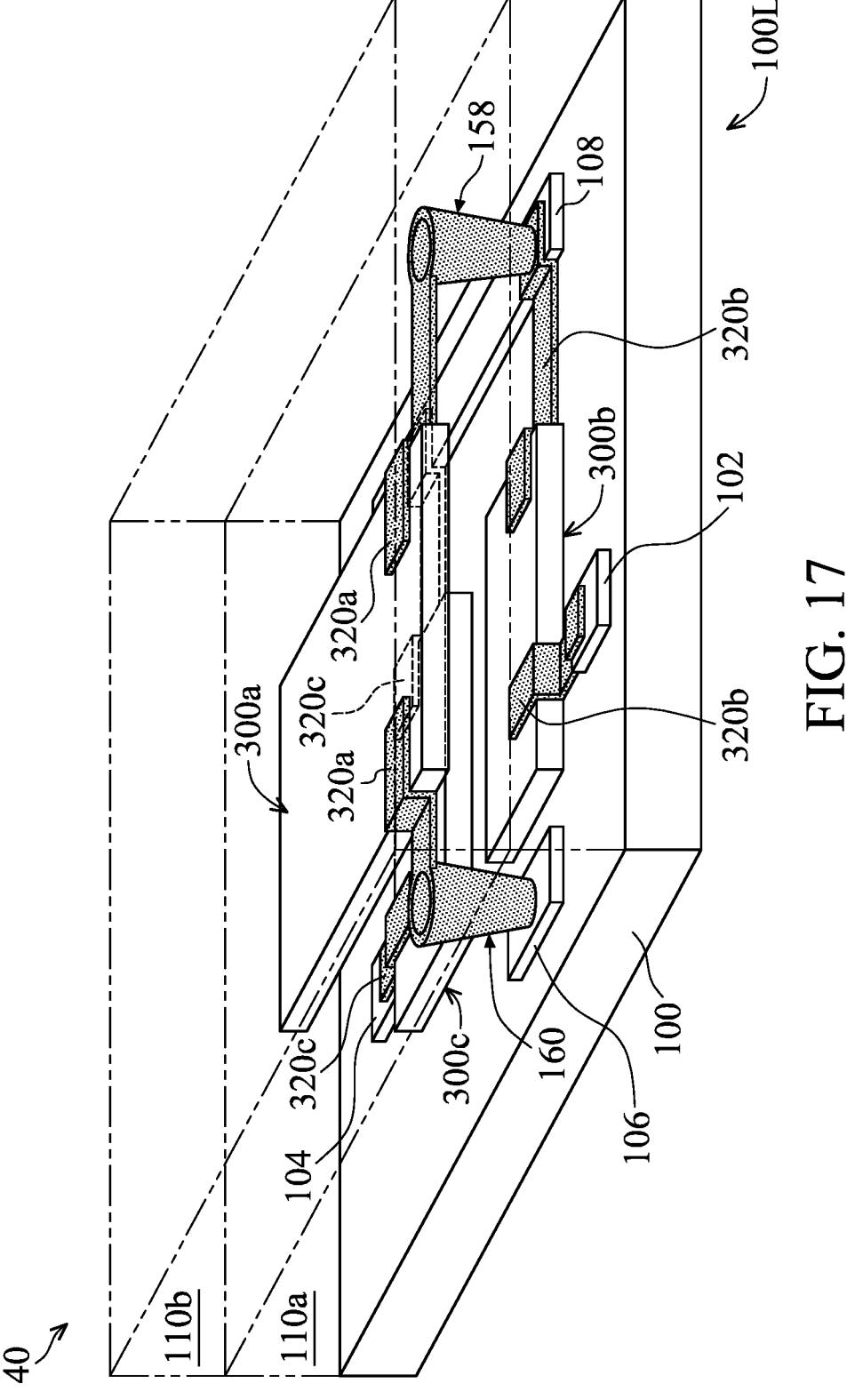
FIG. 17 is a perspective view of a package structure according to other embodiments.

FIG. 17 is a perspective view of a package structure 40 according to other embodiments. The package structure 40 shown in FIG. 17 is similar to the package structure 30 shown in FIG. 16, except that the LED chip 300*a* with a bigger size is disposed above the LED chips 300*b* and 300*c* with a smaller size. In particular, in these embodiments, the LED chips 300*b* and 300*c* are disposed in the planarization layer 110*b* and separated from each other, and the LED chip 300*a* is disposed in the planarization layer 110*a*. In some embodiments, the projection plane of the LED chip 300*a* on the substrate 100 may at least partially overlap the projection planes of the LED chip 300*b* and 300*c* on the substrate 100.

In some specific embodiments, the projection plane of the LED chip 300*a* on the substrate 100 may completely overlap the projection planes of the LED chip 300*b* and 300*c* on the substrate 100. In accordance with some embodiments, the projection area of the LED chip 300*a* on the substrate 100 may be greater than the sum of the projection areas of the LED chip 300*b* and 300*c* on the substrate 100.

In some embodiments, a second side 100L of the substrate 100 on which the LED chips 300*a*, 300*b*, and 300*c* are not disposed may be defined as the light-emitting side of the package structure 40. In the embodiments where the second side 100L is used as the light-emitting side of the package structure 40, the first wavelength of the light emitted by the LED chip 300*a* may be greater than the second wavelength of the light emitted by the LED chip 300*b* and the third wavelength of the light emitted by the LED chip 300*c*. For example, in some embodiments, the LED chips 300*a* may be a red light LED chip and the LED chips 300*b* and 300*c* may respectively be a green light LED chip and a blue light LED chip, or the LED chips 300*b* and 300*c* may respectively be a blue light LED chip and a green light LED chip.

When the second side 100L is used as the light-emitting side of the package structure 40, the light emitted by the LED chips 300*b* and 300*c* may have a shorter wavelength than that emitted by the LED chip 300*a*. This way, the light emitted by the LED chips 300*b* and 300*c* in the planarization layer 110*a* may be prevented from passing through the above planarization layer 110*b*, and the light emitted by the LED chip 300*a*, which is above the LED chips 300*b* and 300*c*, may not be affected accordingly.

In addition, in the embodiments shown in FIG. 17, the LED chip 300*a* may be electrically connected to the electrode 106 and the common electrode 108 through the redistribution layer 320*a*, the LED chip 300*b* may be electrically connected to the electrode 102 and the common electrode 108 through the redistribution layer 320*b*, and the LED chip 300*c* may be electrically connected to the electrode 104 and the common electrode 108 through the redistribution layer 320*c*. In particular, in some embodiments, the redistribution layer 320*a* may be electrically connected to the common electrode 108 and the electrode 106 respectively through vias 158 and 160. That is, the LED chip 300*a* may be electrically connected to the common electrode 108 and the electrode 106 through the redistribution layer 320*a* and the vias 158 and 160. The material and the forming method for the vias 158 and 160 are similar to or the same as those for the vias 152, 154, and 156 in the aforementioned embodiments, which are not repeated again. Furthermore, according to some embodiments, the vias 158 and 160 may extend through the planarization layer 110*a*. In addition, as described in the above embodiment with respect to FIG. 16A, the vias 158 and 160 in the embodiment shown in FIG. 17 may also have an aspect ratio of about 2:1 to about 20:1 (i.e., a ratio of the depth of the vias 158 and 160 to the minimal width of the vias 158 and 160).

In summary, according to some embodiments of the disclosure, the package structure includes a first light-emitting layer, a second light-emitting layer, and a third light-emitting layer sequentially stacked above the substrate. Each of the first light-emitting layer, the second light-emitting layer, and the third light-emitting layer includes a transparent adhesive layer, an LED chip, a redistribution layer, and a planarization layer. The LED chips emitting light with different colors are disposed along the vertical direction in the package structure, and the electrodes used for transmitting signals to the LED chips are disposed on the substrate. Therefore, the package structure with stacked LED chips may reduce the area of a single pixel in a display device, and may enhance the integrated density of pixels and the resolution of the display device. Furthermore, according to some embodiments of the disclosure, the method for forming the package structure includes transferring a single LED chip or LED chips with a certain period from a source wafer to a target substrate, forming the redistribution layer that extends from the light-emitting region to the non-light-emitting region, and forming the planarization layer. The above process may be repeated on the substrate to disposed vertically stacked LED chips. The non-transferred LED chips on the source wafer may remain for the next process. By using the forming method of the package structure provided by the embodiments of the disclosure, space utilization of the source wafer may be increased, the process of the package structure may be simplified, and the yield of the package structure may be improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package structure having a light-emitting region and a non-light-emitting region adjacent to the light-emitting region, comprising:

a substrate; and a first light-emitting layer, a second light-emitting layer, and a third light-emitting layer sequentially stacked above the substrate;

wherein each of the first light-emitting layer, the second light-emitting layer, and the third light-emitting layer comprises:

a transparent adhesive layer disposed in the light-emitting region;

a light-emitting diode (LED) chip disposed on the transparent adhesive layer;

a first redistribution layer and a second redistribution layer formed on the LED chip, wherein the first redistribution layer and the second redistribution layer extend from the light-emitting region to the non-light-emitting region; and a planarization layer disposed on the LED chip and the first redistribution layer and the second redistribution layer;

wherein, in a top view, the package structure has a rectangle shape with a first side, a second side, a third side, and a fourth side different from each other;

wherein the second redistribution layer of the first light-emitting layer extends toward the first side, the second redistribution layer of the second light-emitting layer extends toward the second side, and the second redistribution layer of the third light-emitting layer extends toward the third side.

2. The package structure as claimed in claim 1, wherein the substrate is a backplane or an interposer substrate.

3. The package structure as claimed in claim 1, wherein the substrate is a transparent substrate.

4. The package structure as claimed in claim 1, wherein the LED chip of each of the first light-emitting layer, the second light-emitting layer, and the third light-emitting layer comprises at least one tethered structure on an outer edge of each LED chip.

5. The package structure as claimed in claim 1, wherein projection planes of the LED chips of the first light-emitting layer, the second light-emitting layer, and the third light-emitting layer on the substrate at least partially overlap.

6. The package structure as claimed in claim 1, wherein:

the LED chip of the first light-emitting layer emits light with a first wavelength;

the LED chip of the second light-emitting layer emits light with a second wavelength;

the LED chip of the third light-emitting layer emits light with a third wavelength; and the first wavelength, the second wavelength, and the third wavelength are different from one another.

7. The package structure as claimed in claim 6, wherein a side of the substrate on which the first light-emitting layer, the second light-emitting layer, and the third light-emitting layer are disposed defines a light-emitting side, and wherein the first wavelength is greater than the second wavelength and the second wavelength is greater than the third wavelength.

8. The package structure as claimed in claim 6, wherein a side of the substrate on which the first light-emitting layer, the second light-emitting layer, and the third light-emitting layer are not disposed defines a light-emitting side, and wherein the third wavelength is greater than the second wavelength and the second wavelength is greater than the first wavelength.

9. The package structure as claimed in claim 1, further comprising a first electrode, a second electrode, a third electrode, and a common electrode, wherein the first electrode, the second electrode, the third electrode, and the common electrode are disposed on the substrate within the non-light-emitting region and are in physical contact with the substrate.

10. The package structure as claimed in claim 9, wherein:

the LED chip of the first light-emitting layer is electrically connected to the common electrode and the first electrode by the first redistribution layer and the second redistribution layer of the first light-emitting layer respectively;

the LED chip of the second light-emitting layer is electrically connected to the common electrode and the second electrode by the first redistribution layer and the second redistribution layer of the second light-emitting layer respectively; and the LED chip of the third light-emitting layer is electrically connected to the common electrode and the third electrode by the first redistribution layer and the second redistribution layer of the third light-emitting layer.

11. The package structure as claimed in claim 9, wherein:

the first redistribution layer and the second redistribution layer of the second light-emitting layer are electrically connected to the common electrode and the second electrode respectively through a first via and a second via;

the first redistribution layer and the second redistribution layer of the third light-emitting layer are electrically connected to the common electrode and the third electrode through the first via and a third via, respectively;

the first via and the third via are disposed in the non-light-emitting region and extend through the planarization layers of the first light-emitting layer and the second light-emitting layer; and the second via is disposed in the non-non-light-emitting region and extends through the planarization layer of the first light-emitting layer.

12. The package structure as claimed in claim 11, wherein the third via has an aspect ratio between 2:1 and 20:1.

13. The package structure as claimed in claim 9, wherein:

the first redistribution layer and the second redistribution layer of the second light-emitting layer are electrically connected to the common electrode and the second electrode through a first via and a second via, respectively;

the first redistribution layer and the second redistribution layer of the third light-emitting layer are electrically connected to the common electrode and the third electrode through a third via and a fourth via, respectively;

the first via and the second via are disposed in the non-light-emitting region and extend through the planarization layer of the first light-emitting layer; and the third via and the fourth via are disposed in the non-light-emitting region and extend through the planarization layers of the first light-emitting layer and the second light-emitting layer.

14. A package structure having a light-emitting region and a non-light-emitting region adjacent to the light-emitting region, comprising:

a substrate;

a first light-emitting unit disposed on the substrate;

a first planarization layer disposed on the first light-emitting unit;

a second light-emitting unit and a third light-emitting unit disposed on the first planarization layer and laterally separated from each other; and a second planarization layer disposed on the second light-emitting unit and the third light-emitting unit, wherein each of the first light-emitting unit, the second light-emitting unit, and the third light-emitting unit comprises:

a transparent adhesive layer disposed in the light-emitting region;

an LED chip disposed on the transparent adhesive layer; and a first redistribution layer and a second redistribution layer formed on the LED chip, wherein the first redistribution layer and the second redistribution layer extend from the light-emitting region to the non-light-emitting region;

wherein, in a top view, the package structure has a rectangle shape with a first side, a second side, a third side, and a fourth side different from each other;

wherein the second redistribution layer of the first light-emitting unit extends toward the first side, the second redistribution layer of the second light-emitting unit extends toward the second side, and the second redistribution layer of the third light-emitting unit extends toward the third side.

15. The package structure as claimed in claim 14, wherein the substrate is a backplane or an interposer substrate.

16. The package structure as claimed in claim 14, wherein the substrate is a transparent substrate.

17. The package structure as claimed in claim 14, wherein projection planes of the LED chips of the second light-emitting unit and the third light-emitting unit on the substrate at least partially overlap a projection plane of the LED chip of the first light-emitting unit on the substrate.

18. The package structure as claimed in claim 14, wherein:

the LED chip of the first light-emitting unit emits light with a first wavelength;

the LED chip of the second light-emitting unit emits light with a second wavelength;

the LED chip of the third light-emitting unit emits light with a third wavelength; and the first wavelength is greater than the second wavelength and the third wavelength, and the second wavelength and the third wavelength are different.

19. The package structure as claimed in claim 14, further comprising a first electrode, a second electrode, a third electrode, and a common electrode, wherein the first electrode, the second electrode, the third electrode, and the common electrode are disposed on the substrate within the non-light-emitting region and are in physical contact with the substrate.

20. The package structure as claimed in claim 19, wherein:

the LED chip of the first light-emitting unit is electrically connected to the common electrode and the first electrode by the first redistribution layer and the second redistribution layer of the first light-emitting unit respectively;

the LED chip of the second light-emitting unit is electrically connected to the common electrode and the second electrode by the first redistribution layer and the second redistribution layer of the second light-emitting unit respectively; and the LED chip of the third light-emitting unit is electrically connected to the common electrode and the third electrode by the first redistribution layer and the second redistribution layer of the third light-emitting unit respectively.

21. The package structure as claimed in claim 20, wherein:

the first redistribution layer and the second redistribution layer of the second light-emitting unit are electrically connected to the common electrode and the second electrode through a first via and a second via, respectively;

the first redistribution layer and the second redistribution layer of the third light-emitting unit are electrically connected to the common electrode and the third electrode through a third via and a fourth via, respectively; and the first via, the second via, the third via, and the fourth via are disposed in the non-light-emitting region and extend through the first planarization layer.

22. The package structure as claimed in claim 19, wherein:

the first redistribution layer and the second redistribution layer of the second light-emitting unit are electrically connected to the common electrode and the second electrode through a first via and a second via, respectively;

the first redistribution layer and the second redistribution layer of the third light-emitting unit are electrically connected to the common electrode and the third electrode through the first via and a third via, respectively; and the first via, the second via, and the third via are disposed in the non-light-emitting region and extend through the first planarization layer.

23. The package structure as claimed in claim 1, wherein the first redistribution layer of the first light-emitting layer extends toward the fourth side of the package structure.

24. The package structure as claimed in claim 9, wherein the LED chip of the first light-emitting layer is located between the first electrode and the third electrode.

25. The package structure as claimed in claim 11, wherein the first via and the second via are respectively located on two opposite sides of the LED chip of the second light-emitting layer.

26. The package structure as claimed in claim 14, wherein, in the non-light-emitting region, the first redistribution layer of the first light-emitting unit is vertically overlapped with the first redistribution layer of the second light-emitting unit.

27. The package structure as claimed in claim 14, wherein the first redistribution layer of the first light-emitting unit extends toward the fourth side of the package structure.

28. The package structure as claimed in claim 14, wherein the LED chip of the first light-emitting unit is located between the second electrode and the third electrode.

29. The package structure as claimed in claim 21, wherein the second via and the fourth via are respectively located on two opposite sides of the LED chip of the first light-emitting unit.

30. The package structure as claimed in claim 21, wherein the first via and the third via are located on a same side of the LED chip of the first light-emitting unit.

31. A package structure having a light-emitting region and a non-light-emitting region adjacent to the light-emitting region, comprising:
   a substrate;
   a first light-emitting unit disposed on the substrate;
   a first planarization layer disposed on the first light-emitting unit; and
   a second light-emitting unit, a third light-emitting unit, and a second planarization layer disposed between the first light-emitting unit and the substrate, wherein the second light-emitting unit and the third light-emitting unit are laterally separated from each other; and the second planarization layer covers the second light-emitting unit and the third light-emitting unit;
   wherein each of the first light-emitting unit, the second light-emitting unit, and the third light-emitting unit comprises:
   a transparent adhesive layer disposed in the light-emitting region;
   an LED chip disposed on the transparent adhesive layer; and a first redistribution layer and a second redistribution layer formed on the LED chip, wherein the first redistribution layer and the second redistribution layer extend from the light-emitting region to the non-light-emitting region;
   wherein, in a top view, the package structure has a rectangle shape with a first side, a second side, a third side, and a fourth side different from each other;
   wherein the second redistribution layer of the first light-emitting unit extends toward the first side, the second redistribution layer of the second light-emitting unit extends toward the second side, and the second redistribution layer of the third light-emitting unit extends toward the third side.

32. The package structure as claimed in claim 31, wherein the first redistribution layer of the first light-emitting unit extends toward the fourth side of the package structure.

33. The package structure as claimed in claim 31, wherein projection planes of the LED chips of the second light-emitting unit and the third light-emitting unit on the substrate at least partially overlap a projection plane of the LED chip of the first light-emitting unit on the substrate.

34. The package structure as claimed in claim 31, wherein:
   the LED chip of the first light-emitting unit emits light with a first wavelength;
   the LED chip of the second light-emitting unit emits light with a second wavelength different from the first wavelength; and
   the LED chip of the third light-emitting unit emits light with a third wavelength different from the first wavelength and the second wavelength.

35. The package structure as claimed in claim 31, further comprising a first electrode, a second electrode, a third electrode, and a common electrode, wherein the first electrode, the second electrode, the third electrode, and the common electrode are disposed on the substrate within the non-light-emitting region.

36. The package structure as claimed in claim 35, wherein:
   the LED chip of the first light-emitting unit is electrically connected to the common electrode and the first electrode by the first redistribution layer and the second redistribution layer of the first light-emitting unit respectively;
   the LED chip of the second light-emitting unit is electrically connected to the common electrode and the second electrode by the first redistribution layer and the second redistribution layer of the second light-emitting unit respectively; and
   the LED chip of the third light-emitting unit is electrically connected to the common electrode and the third electrode by the first redistribution layer and the second redistribution layer of the third light-emitting unit respectively.

* * * * *